United States Patent
Ahn et al.

(10) Patent No.: US 7,439,194 B2
(45) Date of Patent: Oct. 21, 2008

(54) LANTHANIDE DOPED TIOX DIELECTRIC FILMS BY PLASMA OXIDATION

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 219 days.

(21) Appl. No.: 11/031,289

(22) Filed: Jan. 7, 2005

(65) Prior Publication Data

US 2005/0124174 A1 Jun. 9, 2005

Related U.S. Application Data

(62) Division of application No. 10/219,870, filed on Aug. 15, 2002, now Pat. No. 6,884,739.

(51) Int. Cl.
*H01L 21/32* (2006.01)

(52) U.S. Cl. ............................ 438/783; 257/E21.675

(58) Field of Classification Search .............. 438/240, 438/287, 592, 679, 763, 770, 778, 785, 591
See application file for complete search history.

(56) References Cited

U.S. PATENT DOCUMENTS

| | | | |
|---|---|---|---|
| 3,381,114 A | 4/1968 | Nakanuma |
| 4,058,430 A | 11/1977 | Suntola et al. |
| 4,215,156 A | 7/1980 | Dalal et al. |
| 4,333,808 A | 6/1982 | Bhattacharyya et al. |
| 4,399,424 A | 8/1983 | Rigby |
| 4,413,022 A | 11/1983 | Suntola et al. |
| 4,590,042 A | 5/1986 | Drage |
| 4,647,947 A | 3/1987 | Takeoka et al. |
| 4,767,641 A | 8/1988 | Kieser et al. |
| 4,920,071 A | 4/1990 | Thomas |
| 4,993,358 A | 2/1991 | Mahawili |
| 5,006,192 A | 4/1991 | Deguchi |
| 5,049,516 A | 9/1991 | Arima |
| 5,055,319 A | 10/1991 | Bunshah et al. |
| 5,426,603 A | 6/1995 | Nakamura et al. |
| 5,478,653 A | 12/1995 | Guenzer |

(Continued)

FOREIGN PATENT DOCUMENTS

EP    1096042    5/2001

(Continued)

OTHER PUBLICATIONS

Aarik, Jaan, et al., "Atomic layer growth of epitaxial TiO/sub 2/ thin films from TiCl/sub 4/ and H/sub 2/O on alpha -Al/sub 2/O/sub 3/ substrates", *Journal of Crystal Growth*, 242(1-2), (2002), 189-198.

(Continued)

*Primary Examiner*—Quoc D Hoang
(74) *Attorney, Agent, or Firm*—Schwegman, Lundberg & Woessner, P.A.

(57) ABSTRACT

A dielectric film containing lanthanide doped $TiO_x$ and a method of fabricating such a dielectric film produce a reliable gate dielectric having an equivalent oxide thickness thinner than attainable using $SiO_2$. A dielectric film is formed by evaporation of Ti, a lanthanide, and oxidation of the evaporated Ti/lanthanide film using an oxygen plasma.

32 Claims, 10 Drawing Sheets

U.S. PATENT DOCUMENTS

| | | | |
|---|---|---|---|
| 5,572,052 A | 11/1996 | Kashihara et al. | |
| 5,595,606 A | 1/1997 | Fujikawa et al. | |
| 5,674,563 A | 10/1997 | Tarui et al. | |
| 5,698,022 A | 12/1997 | Glassman et al. | |
| 5,735,960 A | 4/1998 | Sandhu et al. | |
| 5,777,923 A | 7/1998 | Lee et al. | |
| 5,795,808 A | 8/1998 | Park | |
| 5,801,105 A | 9/1998 | Yano et al. | |
| 5,810,923 A | 9/1998 | Yano et al. | |
| 5,814,584 A | 9/1998 | Tauber et al. | |
| 5,822,256 A | 10/1998 | Bauer et al. | |
| 5,828,080 A | 10/1998 | Yano et al. | |
| 5,840,897 A | 11/1998 | Kirlin et al. | |
| 5,923,056 A | 7/1999 | Lee et al. | |
| 5,950,925 A | 9/1999 | Fukunaga et al. | |
| 5,999,454 A | 12/1999 | Smith | |
| 6,013,553 A | 1/2000 | Wallace et al. | |
| 6,020,024 A | 2/2000 | Maiti et al. | |
| 6,027,961 A | 2/2000 | Maiti et al. | |
| 6,034,015 A | 3/2000 | Lin et al. | |
| 6,057,271 A | 5/2000 | Kenjiro et al. | |
| 6,059,885 A | 5/2000 | Ohashi et al. | |
| 6,060,755 A | 5/2000 | Ma et al. | |
| 6,075,691 A | 6/2000 | Duenas et al. | |
| 6,093,944 A * | 7/2000 | VanDover | 257/310 |
| 6,110,529 A | 8/2000 | Gardiner et al. | |
| 6,161,500 A | 12/2000 | Kopacz et al. | |
| 6,171,900 B1 | 1/2001 | Sun | |
| 6,173,379 B1 | 1/2001 | Poplingher et al. | |
| 6,174,809 B1 | 1/2001 | Kang et al. | |
| 6,203,613 B1 | 3/2001 | Gates et al. | |
| 6,206,972 B1 | 3/2001 | Dunham | |
| 6,207,522 B1 | 3/2001 | Hunt et al. | |
| 6,211,035 B1 | 4/2001 | Moise et al. | |
| 6,225,168 B1 | 5/2001 | Gardner et al. | |
| 6,225,237 B1 | 5/2001 | Vaartstra | |
| 6,258,637 B1 | 7/2001 | Wilk et al. | |
| 6,270,835 B1 | 8/2001 | Hunt et al. | |
| 6,274,937 B1 | 8/2001 | Ahn et al. | |
| 6,281,042 B1 | 8/2001 | Ahn et al. | |
| 6,281,144 B1 | 8/2001 | Cleary et al. | |
| 6,289,842 B1 | 9/2001 | Tompa | |
| 6,297,103 B1 | 10/2001 | Ahn et al. | |
| 6,297,539 B1 | 10/2001 | Ma et al. | |
| 6,302,964 B1 | 10/2001 | Umotoy et al. | |
| 6,303,481 B2 | 10/2001 | Park | |
| 6,313,035 B1 | 11/2001 | Sandhu et al. | |
| 6,350,704 B1 | 2/2002 | Ahn et al. | |
| 6,368,941 B1 | 4/2002 | Chen et al. | |
| 6,380,579 B1 | 4/2002 | Nam et al. | |
| 6,383,861 B1 | 5/2002 | Gonzalez et al. | |
| 6,387,712 B1 | 5/2002 | Yano et al. | |
| 6,391,769 B1 | 5/2002 | Lee et al. | |
| 6,392,257 B1 | 5/2002 | Ramdani et al. | |
| 6,395,650 B1 | 5/2002 | Callegari et al. | |
| 6,407,427 B1 | 6/2002 | Oh | |
| 6,432,779 B1 | 8/2002 | Hobbs et al. | |
| 6,433,993 B1 | 8/2002 | Hunt et al. | |
| 6,444,039 B1 | 9/2002 | Nguyen | |
| 6,445,023 B1 | 9/2002 | Vaartstra et al. | |
| 6,451,695 B2 | 9/2002 | Sneh | |
| 6,454,912 B1 | 9/2002 | Ahn et al. | |
| 6,458,701 B1 | 10/2002 | Chae et al. | |
| 6,465,853 B1 | 10/2002 | Hobbs et al. | |
| 6,495,436 B2 | 12/2002 | Ahn et al. | |
| 6,514,820 B2 | 2/2003 | Ahn et al. | |
| 6,514,828 B2 | 2/2003 | Ahn et al. | |
| 6,518,610 B2 | 2/2003 | Yang et al. | |
| 6,527,866 B1 | 3/2003 | Matijasevic et al. | |
| 6,531,354 B2 | 3/2003 | Maria et al. | |
| 6,534,420 B2 | 3/2003 | Ahn et al. | |
| 6,541,079 B1 | 4/2003 | Bojarczuk, Jr. et al. | |
| 6,541,280 B2 | 4/2003 | Kaushik et al. | |
| 6,544,846 B2 | 4/2003 | Ahn et al. | |
| 6,544,875 B1 | 4/2003 | Wilk | |
| 6,552,383 B2 | 4/2003 | Ahn et al. | |
| 6,559,014 B1 | 5/2003 | Jeon | |
| 6,570,248 B1 | 5/2003 | Ahn et al. | |
| 6,573,199 B2 | 6/2003 | Sandhu et al. | |
| 6,602,338 B2 | 8/2003 | Chen et al. | |
| 6,613,656 B2 | 9/2003 | Li | |
| 6,613,702 B2 | 9/2003 | Sandhu et al. | |
| 6,620,752 B2 | 9/2003 | Messing et al. | |
| 6,632,279 B1 | 10/2003 | Ritala et al. | |
| 6,639,267 B2 | 10/2003 | Eldridge | |
| 6,674,138 B1 | 1/2004 | Halliyal et al. | |
| 6,699,747 B2 | 3/2004 | Ruff et al. | |
| 6,710,538 B1 | 3/2004 | Ahn et al. | |
| 6,720,221 B1 | 4/2004 | Ahn et al. | |
| 6,728,092 B2 | 4/2004 | Hunt et al. | |
| 6,730,575 B2 | 5/2004 | Eldridge | |
| 6,753,567 B2 | 6/2004 | Maria et al. | |
| 6,756,298 B2 | 6/2004 | Ahn et al. | |
| 6,767,582 B1 | 7/2004 | Elers | |
| 6,774,050 B2 | 8/2004 | Ahn et al. | |
| 6,778,441 B2 | 8/2004 | Forbes et al. | |
| 6,780,704 B1 | 8/2004 | Raaijmakers et al. | |
| 6,787,370 B2 | 9/2004 | Forbes et al. | |
| 6,787,413 B2 | 9/2004 | Ahn et al. | |
| 6,790,791 B2 | 9/2004 | Ahn et al. | |
| 6,794,709 B2 | 9/2004 | Ahn et al. | |
| 6,803,326 B2 | 10/2004 | Ahn et al. | |
| 6,812,100 B2 | 11/2004 | Ahn et al. | |
| 6,821,862 B2 | 11/2004 | Cho | |
| 6,821,873 B2 | 11/2004 | Visokay et al. | |
| 6,831,315 B2 | 12/2004 | Raaijmakers et al. | |
| 6,833,285 B1 | 12/2004 | Ahn et al. | |
| 6,833,308 B2 | 12/2004 | Ahn et al. | |
| 6,835,111 B2 | 12/2004 | Ahn et al. | |
| 6,844,203 B2 | 1/2005 | Ahn et al. | |
| 6,858,120 B2 | 2/2005 | Ahn et al. | |
| 6,858,444 B2 | 2/2005 | Ahn et al. | |
| 6,858,865 B2 | 2/2005 | Ahn et al. | |
| 6,884,739 B2 * | 4/2005 | Ahn et al. | 438/783 |
| 6,888,739 B2 | 5/2005 | Forbes | |
| 6,893,984 B2 | 5/2005 | Ahn et al. | |
| 6,900,122 B2 | 5/2005 | Ahn et al. | |
| 6,900,481 B2 | 5/2005 | Jin et al. | |
| 6,914,800 B2 | 7/2005 | Ahn et al. | |
| 6,919,266 B2 | 7/2005 | Ahn et al. | |
| 6,921,702 B2 | 7/2005 | Ahn et al. | |
| 6,930,346 B2 | 8/2005 | Ahn et al. | |
| 6,953,730 B2 | 10/2005 | Ahn et al. | |
| 6,958,302 B2 | 10/2005 | Ahn et al. | |
| 6,960,538 B2 | 11/2005 | Ahn et al. | |
| 6,989,573 B2 | 1/2006 | Ahn et al. | |
| 7,026,694 B2 | 4/2006 | Ahn et al. | |
| 7,045,430 B2 | 5/2006 | Ahn et al. | |
| 7,068,544 B2 | 6/2006 | Forbes et al. | |
| 7,081,421 B2 | 7/2006 | Ahn et al. | |
| 7,101,813 B2 | 9/2006 | Ahn et al. | |
| 7,135,369 B2 | 11/2006 | Ahn et al. | |
| 7,160,577 B2 | 1/2007 | Ahn et al. | |
| 7,160,817 B2 | 1/2007 | Marsh | |
| 7,183,186 B2 | 2/2007 | Ahn et al. | |
| 7,192,824 B2 | 3/2007 | Ahn et al. | |
| 7,195,999 B2 | 3/2007 | Forbes et al. | |
| 7,199,023 B2 | 4/2007 | Ahn et al. | |
| 7,205,218 B2 | 4/2007 | Ahn et al. | |
| 7,205,620 B2 | 4/2007 | Ahn et al. | |
| 7,208,804 B2 | 4/2007 | Ahn et al. | |
| 7,211,492 B2 | 5/2007 | Forbes et al. | |
| 7,214,994 B2 | 5/2007 | Forbes et al. | |
| 7,235,501 B2 | 6/2007 | Ahn et al. | |

| | | | | | | |
|---|---|---|---|---|---|---|
| 7,235,854 B2 | 6/2007 | Ahn et al. | | 2004/0189175 A1 | 9/2004 | Ahn et al. |
| 7,259,434 B2 | 8/2007 | Ahn et al. | | 2004/0196620 A1 | 10/2004 | Knudsen et al. |
| 2001/0002280 A1 | 5/2001 | Sneh | | 2004/0219783 A1 | 11/2004 | Ahn et al. |
| 2001/0030352 A1 | 10/2001 | Ruf et al. | | 2004/0248398 A1 | 12/2004 | Ahn et al. |
| 2002/0001971 A1 | 1/2002 | Cho | | 2004/0262700 A1 | 12/2004 | Ahn et al. |
| 2002/0004276 A1 | 1/2002 | Ahn et al. | | 2004/0264236 A1 | 12/2004 | Chae et al. |
| 2002/0004277 A1 | 1/2002 | Ahn et al. | | 2005/0009370 A1 | 1/2005 | Ahn |
| 2002/0019116 A1 | 2/2002 | Sandhu et al. | | 2005/0020017 A1 | 1/2005 | Ahn et al. |
| 2002/0024080 A1 | 2/2002 | Derderian et al. | | 2005/0023574 A1 | 2/2005 | Forbes et al. |
| 2002/0025628 A1 | 2/2002 | Derderian et al. | | 2005/0023594 A1 | 2/2005 | Ahn et al. |
| 2002/0046705 A1 | 4/2002 | Sandhu et al. | | 2005/0023595 A1 | 2/2005 | Forbes et al. |
| 2002/0053869 A1 | 5/2002 | Ahn et al. | | 2005/0023602 A1 | 2/2005 | Forbes et al. |
| 2002/0089023 A1 | 7/2002 | Yu et al. | | 2005/0023603 A1 | 2/2005 | Eldridge et al. |
| 2002/0100418 A1 | 8/2002 | Sandhu et al. | | 2005/0023627 A1 | 2/2005 | Ahn et al. |
| 2002/0102818 A1 | 8/2002 | Sandhu et al. | | 2005/0026349 A1 | 2/2005 | Forbes et al. |
| 2002/0110991 A1 | 8/2002 | Li | | 2005/0029547 A1 | 2/2005 | Ahn et al. |
| 2002/0117704 A1 | 8/2002 | Gonzalez | | 2005/0029604 A1 | 2/2005 | Ahn et al. |
| 2002/0122885 A1 | 9/2002 | Ahn | | 2005/0029605 A1 | 2/2005 | Ahn et al. |
| 2002/0132374 A1 | 9/2002 | Basceri et al. | | 2005/0030825 A1 | 2/2005 | Ahn |
| 2002/0135048 A1 | 9/2002 | Ahn et al. | | 2005/0032292 A1 | 2/2005 | Ahn et al. |
| 2002/0142536 A1 | 10/2002 | Zhang et al. | | 2005/0032342 A1 | 2/2005 | Forbes et al. |
| 2002/0145845 A1 | 10/2002 | Hunt et al. | | 2005/0034662 A1 | 2/2005 | Ahn |
| 2002/0155688 A1 | 10/2002 | Ahn et al. | | 2005/0037563 A1 | 2/2005 | Ahn |
| 2002/0155689 A1 | 10/2002 | Ahn et al. | | 2005/0077519 A1 | 4/2005 | Ahn et al. |
| 2002/0164420 A1 | 11/2002 | Derderian et al. | | 2005/0124174 A1 | 6/2005 | Ahn et al. |
| 2002/0167057 A1 | 11/2002 | Ahn et al. | | 2005/0145957 A1 | 7/2005 | Ahn et al. |
| 2002/0170671 A1 | 11/2002 | Matsuhita et al. | | 2005/0158973 A1 | 7/2005 | Ahn et al. |
| 2002/0176989 A1 | 11/2002 | Knudsen et al. | | 2005/0164521 A1 | 7/2005 | Ahn et al. |
| 2002/0177244 A1 | 11/2002 | Hsu et al. | | 2005/0285225 A1 | 12/2005 | Ahn et al. |
| 2002/0192974 A1 | 12/2002 | Ahn et al. | | 2006/0043492 A1 | 3/2006 | Ahn et al. |
| 2002/0192975 A1 | 12/2002 | Ahn | | 2006/0043504 A1 | 3/2006 | Ahn et al. |
| 2002/0192979 A1 | 12/2002 | Ahn | | 2006/0046505 A1 | 3/2006 | Ahn et al. |
| 2002/0195056 A1 | 12/2002 | Sandhu et al. | | 2006/0046522 A1 | 3/2006 | Ahn et al. |
| 2003/0003702 A1 | 1/2003 | Ahn et al. | | 2006/0125030 A1 | 6/2006 | Ahn et al. |
| 2003/0003722 A1 | 1/2003 | Vaartstra | | 2006/0128168 A1 | 6/2006 | Ahn et al. |
| 2003/0003730 A1 | 1/2003 | Li | | 2006/0148180 A1 | 7/2006 | Ahn et al. |
| 2003/0017717 A1 | 1/2003 | Ahn et al. | | 2006/0176645 A1 | 8/2006 | Ahn et al. |
| 2003/0027360 A1 | 2/2003 | Hsu et al. | | 2006/0177975 A1 | 8/2006 | Ahn et al. |
| 2003/0043637 A1 | 3/2003 | Forbes et al. | | 2006/0183272 A1 | 8/2006 | Ahn et al. |
| 2003/0045060 A1 | 3/2003 | Ahn et al. | | 2006/0189154 A1 | 8/2006 | Ahn et al. |
| 2003/0045078 A1 | 3/2003 | Ahn et al. | | 2006/0223337 A1 | 10/2006 | Ahn et al. |
| 2003/0064607 A1 | 4/2003 | Leu et al. | | 2006/0228868 A1 | 10/2006 | Ahn et al. |
| 2003/0119246 A1 | 6/2003 | Ahn | | 2006/0237764 A1 | 10/2006 | Ahn et al. |
| 2003/0119291 A1 | 6/2003 | Ahn et al. | | 2006/0244082 A1 | 11/2006 | Ahn et al. |
| 2003/0124794 A1 | 7/2003 | Girardie | | 2006/0244100 A1 | 11/2006 | Ahn et al. |
| 2003/0132491 A1 | 7/2003 | Ahn | | 2006/0245984 A1 | 11/2006 | Kulkarni et al. |
| 2003/0139039 A1 | 7/2003 | Ahn et al. | | 2006/0246741 A1 | 11/2006 | Ahn et al. |
| 2003/0157764 A1 | 8/2003 | Ahn et al. | | 2006/0252211 A1 | 11/2006 | Ahn et al. |
| 2003/0207540 A1 | 11/2003 | Ahn et al. | | 2006/0255470 A1 | 11/2006 | Ahn et al. |
| 2003/0207564 A1 | 11/2003 | Ahn et al. | | 2006/0261397 A1 | 11/2006 | Ahn et al. |
| 2003/0216038 A1 | 11/2003 | Madhukar et al. | | 2006/0263972 A1 | 11/2006 | Ahn et al. |
| 2003/0227033 A1 | 12/2003 | Ahn et al. | | 2006/0264064 A1 | 11/2006 | Ahn et al. |
| 2003/0228747 A1 | 12/2003 | Ahn et al. | | 2006/0270147 A1 | 11/2006 | Ahn et al. |
| 2003/0235961 A1 | 12/2003 | Metzner et al. | | 2006/0281330 A1 | 12/2006 | Ahn et al. |
| 2004/0004244 A1 | 1/2004 | Ahn et al. | | 2007/0007560 A1 | 1/2007 | Forbes et al. |
| 2004/0007171 A1 | 1/2004 | Ritala et al. | | 2007/0007635 A1 | 1/2007 | Forbes et al. |
| 2004/0016944 A1 | 1/2004 | Ahn et al. | | 2007/0010060 A1 | 1/2007 | Forbes et al. |
| 2004/0023461 A1 | 2/2004 | Ahn et al. | | 2007/0010061 A1 | 1/2007 | Forbes et al. |
| 2004/0033681 A1 | 2/2004 | Ahn et al. | | 2007/0018214 A1 | 1/2007 | Ahn |
| 2004/0033701 A1 | 2/2004 | Ahn et al. | | 2007/0037415 A1 | 2/2007 | Ahn et al. |
| 2004/0038554 A1 | 2/2004 | Ahn | | 2007/0045676 A1 | 3/2007 | Forbes et al. |
| 2004/0043541 A1 | 3/2004 | Ahn et al. | | 2007/0045752 A1 | 3/2007 | Forbes et al. |
| 2004/0043635 A1 | 3/2004 | Vaartstra | | 2007/0049023 A1 | 3/2007 | Ahn et al. |
| 2004/0110348 A1 | 6/2004 | Ahn et al. | | 2007/0049051 A1 | 3/2007 | Ahn et al. |
| 2004/0110391 A1 | 6/2004 | Ahn et al. | | 2007/0049054 A1 | 3/2007 | Ahn et al. |
| 2004/0159863 A1 | 8/2004 | Eldridge et al. | | 2007/0059881 A1 | 3/2007 | Ahn et al. |
| 2004/0164357 A1 | 8/2004 | Ahn et al. | | 2007/0087563 A1 | 4/2007 | Ahn et al. |
| 2004/0164365 A1 | 8/2004 | Ahn et al. | | 2007/0090441 A1 | 4/2007 | Ahn et al. |
| 2004/0169453 A1 | 9/2004 | Ahn et al. | | 2007/0092989 A1 | 4/2007 | Kraus et al. |
| 2004/0175882 A1 | 9/2004 | Ahn et al. | | 2007/0099366 A1 | 5/2007 | Ahn et al. |
| 2004/0178439 A1 | 9/2004 | Ahn et al. | | 2007/0101929 A1 | 5/2007 | Ahn et al. |
| 2004/0183108 A1 | 9/2004 | Ahn | | 2007/0107661 A1 | 5/2007 | Ahn |
| 2004/0185654 A1 | 9/2004 | Ahn | | 2007/0111544 A1 | 5/2007 | Ahn |

| 2007/0131169 | A1 | 6/2007 | Ahn |
| 2007/0181931 | A1 | 8/2007 | Ahn et al. |
| 2007/0187772 | A1 | 8/2007 | Ahn et al. |
| 2007/0187831 | A1 | 8/2007 | Ahn et al. |
| 2007/0234949 | A1 | 10/2007 | Ahn et al. |

FOREIGN PATENT DOCUMENTS

| EP | 1124262 | 8/2001 |
| JP | 62-199019 | 9/1987 |
| JP | 5090169 | 4/1993 |
| JP | 2001-332546 | 11/2001 |

OTHER PUBLICATIONS

Aarik, Jaan, et al., "Phase transformations in hafnium dioxide thin films grown by atomic layer deposition at high temperatures", *Applied Surface Science*, 173(1-2), (Mar. 2001), 15-21.

Aarik, Jaan, et al., "Texture development in nanocrystalline hafnium dioxide thin films grown by atomic layer deposition", *Journal of Crystal Growth*, 220(1-2), (Nov. 15, 2000), 105-113.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991), 619-621.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Copel, M., et al., "Structure and stability of ultrathin zirconium oxide layers on Si(001)", *Applied Physics Letters*, 76(4), (Jan. 2000), 436-438.

Desu, S B., "Minimization of Fatigue in Ferroelectric Films", *Physica Status Solidi A*, 151(2), (1995), 467-480.

Engelhardt, M., "Modern Applications of Plasma Etching and Patterning in Silicon Process Technology", *Contributions to Plasma Physics*, 39(5), (1999), 473-478.

Forsgren, Katarina, "Atomic Layer Deposition of HfO2 using hafnium iodide", *Conference held in Monterey, California*, (May 2001), 1 page.

Fuyuki, Takashi, et al., "Electronic Properties of the Interface between Si and TiO2 Deposited at Very Low Temperatures", *Japanese Journal of Applied Physics*, 25(9), (1986), 1288-1291.

Fuyuki, Takashi, et al., "Initial stage of ultra-thin SiO/sub 2/ formation at low temperatures using activated oxygen", *Applied Surface Science*, 117-118, (Jun. 1997), 123-126.

Gartner, M., et al., "Spectroellipsometric characterization of lanthanide-doped TiO/sub 2/ films obtained via the sol-gel technique", *Thin Solid Films*, 234(1-2), (1993), 561-565.

Geller, S., et al., "Crystallographic Studies of Perovskite-like Compounds. II. Rare Earth Aluminates", *Acta Cryst.*, 9, (May 1956), 1019-1025.

Giess, E. A., et al., "Lanthanide gallate perovskite-type substrates for epitaxial, high-T/sub c/ superconducting Ba/sub 2/YCu/sub 3/O/sub 7- delta / films", *IBM Journal of Research and Development*, 34(6), (Nov. 1990), 916-926.

Hirayama, Masaki, et al., "Low-Temperature Growth of High-Integrity Silicon Oxide Films by Oxygen Radical Generated in High Density Krypton Plasma", *International Electron Devices Meeting 1999. Technical Digest*, (1999), 249-252.

Hubbard, K. J., "Thermodynamic stability of binary oxides in contact with silicon", *Journal of Materials Research*, 11(11), (Nov. 1996), 2757-2776.

Hunt, C. E., et al., "Direct bonding of micromachined silicon wafers for laser diode heat exchanger applications", *Journal of Micromechanics and Microengineering*, 1(3), (Sep. 1991), 152-156.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Jeong, Chang-Wook, et al., "Plasma-Assisted Atomic layer Growth of High-Quality Aluminum Oxide Thin Films", *Japanese Journal of Applied Physics*, 40, (Jan. 2001), 285-289.

Kawai, Y, et al., "Ultra-low-temperature growth of high-integrity gate oxide films by low-energy Ion-assisted oxidation", *Applied Physics Letters*, 64(17), (Apr. 1994), 2223-2225.

Keomany, D., et al., "Sol gel preparation of mixed cerium-titanium oxide thin films", *Solar Energy Materials and Solar Cells*, 33(4), (Aug. 1994), 429-441.

Kim, C. T., et al., "Application of Al2O3 Grown by Atomic Layer Deposition to DRAM and FeRAM", *12th International Symposium in Integrated Ferroelectrics*, (Mar. 2000), p. 316.

Kim, D., et al., "Atomic Control of Substrate Termination and Heteroepitaxial Growth of SrTiO3/LaAlO3 Films", *Journal of the Korean Physical Society*, 36(6), (Jun. 2000), 444-448.

Kim, Y, et al., "Substrate dependence on the optical properties of Al2O3 films grown by atomic layer deposition", *Applied Physics Letters*, 71(25), (Dec. 22, 1997), 3604-3606.

Krauter, G., et al., "Room Temperature Silicon Wafer Bonding with Ultra-Thin Polymer Films", *Advanced Materials*, 9(5), (1997), 417-420.

Kukli, Kaupo, "Atomic Layer Deposition of Titanium Oxide TiI4 and H2O2", *Chemical Vapor Deposition*, 6(6), (2000), 303-310.

Kukli, K, et al., "Controlled growth of yttrium oxysulphide thin films by atomic layer deposition", *Materials Science Forum*, 315-317, (1999), 216-221.

Kukli, Kaupo, et al., "Dielectric Properties of Zirconium Oxide Grown by Atomic Layer Deposition from Iodide Precursor", *Journal of The Electrochemical Society*, 148(12),(2001), F227-F232.

Lee, A E., et al., "Epitaxially grown sputtered LaAlO3 films", *Applied Physics Letters*, 57(19), (Nov. 1990), 2019-2021.

Lee, Cheng-Chung, et al., "Ion-assisted deposition of silver thin films", *Thin Solid Films*, 359(1) , (Jan. 2000), 95-97.

Lee, Dong H., et al., "Metalorganic chemical vapor deposition of TiO/sub 2/:N anatase thin film on Si substrate", *Applied Physics Letters*, 66(7), (Feb. 1995, 815-816.

Lee, L P., et al., "Monolithic 77 K dc SQUID magnetometer", *Applied Physics Letters*, 59(23), (Dec. 1991), 3051-3053.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000), 27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001), 137-138.

Lee, Byoung H., et al., "Ultrathin Hafnium Oxide with Low Leakage and Excellent Reliability for Alternative Gate Dielectric Application", *Technical Digest of IEDM*, (1999), 133-136.

Leskela, M, et al., "ALD precursor chemistry: Evolution and future challenges", *Journal de Physique IV (Proceedings)*, 9(8), (Sep. 1999), 837-852.

Liu, C. T., "Circuit Requirement and Integration Challenges of Thin Gate Dielectrics for Ultra Small MOSFETs", *International Electron Devices Meeting 1998. Technical Digest*, (1998), 747-750.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999), 1911-1915.

Lucovsky, G, et al., "Microscopic model for enhanced dielectric constants in low concentration SiO/sub 2/-rich noncrystalline Zr and Hf silicate alloys", *Applied Physics Letters*, 77(18), (Oct. 2000), 2912-2914.

Luo, Z J., et al., "Ultra-thin ZrO2 (or Silicate) with High Thermal Stability for CMOS Gate Applications", *2001 Symposium on VLSI Technology Digest of Technical Papers*, (2001), 135-136.

Martin, P J., et al., "Ion-beam-assisted deposition of thin films", *Applied Optics*, 22(1), (Jan. 1983), 178-184.

Molodyk, A A., et al., "Volatile Surfactant-Assisted MOCVD: Application to LaAlO3 Thin Film Growth", *Chemical Vapor Deposition*, 6(3), (Jun. 2000), 133-138.

Molsa, Heini, et al., "Growth of yttrium oxide thin films from beta-diketonate precursor", *Advanced Materials for Optics and Electronics*, 4(6), (Nov.-Dec. 1994), 389-400.

Muller, D. A., "The electronic structure at the atomic scale of ultrathin gate oxides", *Nature*, 399(6738), (Jun. 24, 1999), 758-61.

Nakagawara, Osamu, et al., "Electrical properties of (Zr, Sn)TiO4 dielectric thin film prepared by pulsed laser deposition", *Journal of Applied Physics*, 80(1), (Jul. 1996), 388-392.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001), 1801-1808.

Nieminen, Minna , et al., "Formation and stability of lanthanum oxide thin films deposited from B-diketonate precursor", *Applied Surface Science*, 174(2), (Apr. 16, 2001), 155-165.

Niilisk, A , "Atomic-scale optical monitoring of the initial growth of TiO2 thin films", *Proceedings of the SPIE—The International Society for Optical Engineering*, 4318, (2001), 72-77.

Ohring, Milton , "The Materials Science of Thin Films", *Boston : Academic Press*, (1992), 118, 121, 125.

Osten, H. J., et al., "High-k gate dielectrics with ultra-low leakage current based on praseodymium oxide", *International Electron Devices Meeting 2000 Technical Digest. IEDM*, (2000), 653-656.

Pan, Tung M., et al., "High quality ultrathin CoTiO/sub 3/ high-k gate dielectrics", *Electrochemical and Solid-State Letters*, 3(9), (Sep. 2000), 433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001), 1439-1441.

Park, Byung-Eun , et al., "Electrical properties of LaAlO3/Si and Sr0.8Bi2.2Ta2O9/LaAlO3/Si structures", *Applied Physics Letters*, 79(6), (Aug. 2001), 806-808.

Qi, Wen-Jie , et al., "MOSCAP and MOSFET characteristics using Zr02 gate dielectric deposited directly on Si", *Electron Devices Meeting, 1999. IEDM Technical Digest. International*, (1999), 145-148.

Qi, Wen-Jie , et al., "Performance of MOSFETs with ultra thin ZrO2 and Zr-silicate gate dielectrics", *2000 Symposium on VLSI Technology, Digest of Technical Papers*, (2000), 40-41.

Ramakrishnan, E S., et al., "Dielectric properties of radio frequency magnetron sputter deposited zirconium titanate-based thin films", *Journal of the Electrochemical Society*, 145(1), (Jan. 1998), 358-362.

Rayner Jr., G , et al., "The structure of plasma-deposited and annealed pseudo-binary ZrO2-SiO2 alloys", *Materials Research Society Symposium—Proceedings*, 611, (2000), C131-C139.

Ritala, Mikko , "Atomic Layer Epitaxy Growth of Titanium, Zirconium and Hafnium Dioxide Thin Films", *Annales Academiae Scientiarum Fennicae*, (1994), 24-25.

Ritala, Mikko , "Zirconium dioxide thin films deposited by ALE using zirconium tetrachloride as precursor", *Applied Surface Science*, 75, (Jan. 1994), 333-340.

Saito, Yuji, et al., "Advantage of Radical Oxidation for Improving Reliability of Ultra-Thin Gate Oxide", *2000 Symposium on VLSI Technology Digest of Technical Papers*, (2000), 176-177.

Saito, Y , et al., "High-Integrity Silicon Oxide Grown at Low-temperature by Atomic Oxygen Generated in High-Density Krypton Plasma", *Extended Abstracts of the 1999 International Conference on Solid State Devices and Materials*, (1999), 152-153.

Shanware, A , et al., "Reliability evaluation of HfSiON gate dielectric film with 12.8 A SiO2 equivalent thickness", *International Electron Devices Meeting. Technical Digest*, (2001), 6.6.1-6.6.4.

Shin, Chang H., et al., "Fabrication and Characterization of MFISFET using Al2O3 Insulating Layer for Non-Volatile Memory", *12th International Symposium in Integrated Ferroelectrics*, (Mar. 2000), 1-9.

Song, Hyun-Jung , et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999), 469-471.

Suntola, T. , "Atomic Layer Epitaxy", *Handbook of Crystal Growth, 3; Thin Films of Epitaxy, Part B: Growth Mechanics and Dynamics*, Amsterdam,(1994), 602-663.

Suntola, T , "Atomic layer epitaxy", *Thin Solid Films*, 216(1), (Aug. 28, 1992), 84-89.

Sze, S M., "Physics of Semiconductor Devices", *New York : Wiley*, (1981), 431.

Sze, S M., "Physics of Semiconductor Devices", *New York : Wiley*, (1981), 473.

Takemoto, J. H., et al., "Microstrip Resonators and Filters Using High-TC Superconducting Thin Films on LaAlO3", *IEEE Transaction on Magnetics*, 27(2), (Mar. 1991), 2549-2552.

Tarre, A , et al., "Comparative study of low-temperature chloride atomic-layer chemical vapor deposition of TiO2 and SnO2", *Applied Surface Science*, 175-176, (May 2001), 111-116.

Van Dover, R. B., "Amorphous lanthanide-doped TiOx dielectric films", *Applied Physics Letters*, 74(20), (May 17, 1999), 3041-3043.

Van Dover, Robert B., et al., "Deposition of Uniform Zr-Sn-Ti-O films by ON-Axis Reactive Sputtering", *IEEE Electron Device Letters*, 19(9), (Sep. 1998), 329-331.

Van Dover, R. B., et al., "Discovery of a useful thin-film dieletric using a composition-spread approach", *Nature*, 392, (Mar. 12, 1998), 162-164.

Viirola, H , "Controlled growth of antimony-doped tin dioxide thin films by atomic layer epitaxy", *Thin Solid Films*, 251, (Nov. 1994), 127-135.

Viirola, H , "Controlled growth of tin oxide thin films by atomic layer epitaxy", *Thin Solid Films*, 249(2), (Sep. 1994), 144-149.

Wilk, G D., et al., "Hafnium and zirconium silicates for advanced gate dielectrics", *Journal of Applied Physics*, 87(1), (Jan. 2000),484-492.

Wilk, G. D., et al., "High-K gate dielectrics: Current status and materials properties considerations", *Journal of Applied Physics*, 89(10), (May 2001), 5243-5275.

Wolf, Stanley , et al., "Future Trends in Sputter Deposition Processes", *In: Silicon Processing of the VLSI Era*, vol. 1, Lattice Press, (1986),3 74-380.

Wolf, Stanley , et al., "Silicon Processing for the VLSI Era—vol. I: Process Technology", *Second Edition, Lattice Press*, Sunset Beach, California, (2000), 443.

Yamaguchi, Takeshi , "Band Diagram and Carrier Conduction Mechanism in ZrO2/Zr-silicate/Si MIS Structure Fabricated by Pulsed-laser-ablation Oct. 2, 2006 Deposition", *Electron Devices Meeting, 2000. IEDM Technical Digest. International*, (2000), 19-22.

Zhang, H. , "Atomic Layer Deposition of High Dielectric Constant Nanolaminates", *Journal of The Electrochemical Society*, 148(4), (Apr. 2001), F63-F66.

Zhang, H , "High permittivity thin film nanolaminates", *Journal of Applied Physics*, 87(4), (Feb. 2000), 1921-1924.

Zhu, W , et al., "HfO2 and HfAlO for CMOS: Thermal Stability and Current Transport", *IEEE International Electron Device Meeting 2001*, (2001), 463-466.

Zucker, O , et al., "Application of Oxygen Plasma Processing to Silicon Direct Bonding", *Sensor and Actuators A*, 36, (1993), 227-231.

Fuyuki, Takashi, et al., "Electronic Properties of the Interface between Si and $TiO_2$ Deposited at Very Low Temperatures", *Japanese Journal of Applied Physics, Part 1(Regular Papers & Shorts Notes)*, 25(9), (Sep. 1986), 1288-1291.

* cited by examiner

US 7,439,194 B2

LANTHANIDE DOPED TIOX DIELECTRIC FILMS BY PLASMA OXIDATION

RELATED APPLICATIONS

This application is related to the following commonly assigned applications, incorporated herein by reference:

U.S. application Ser. No. 09/779,959, entitled "Formation of Metal Oxide Gate Dielectric," now issued as U.S. Pat. No. 6,495,436;

U.S. application Ser. No. 09/908,767, entitled "Methods for Forming Dielectric Materials and Methods for Forming Semiconductor Devices," now issued as U.S. Pat. No. 6,534,420; and U.S. application Ser. No. 10/219,878, entitled "Lanthanide doped $TiO_x$ Dielectric Films," now issued as U.S. Pat. No. 6,790,791.

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a source region 120 and a drain region 130. A body region 132 is located between source region 120 and drain region 130, the body region 132 defining a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate dielectric 140. The mainstay for forming the gate dielectric has been silicon dioxide, $SiO_2$. Thermally grown amorphous $SiO_2$ provides an electrically and thermodynamically stable material, where the interface of a $SiO_2$ layer with an underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but with increased scaling, other requirements for gate dielectrics create the need to find other dielectric materials to be used for a gate dielectric.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

DETAILED DESCRIPTION OF THE PREFERRED EMBODIMENTS

Figure 1:
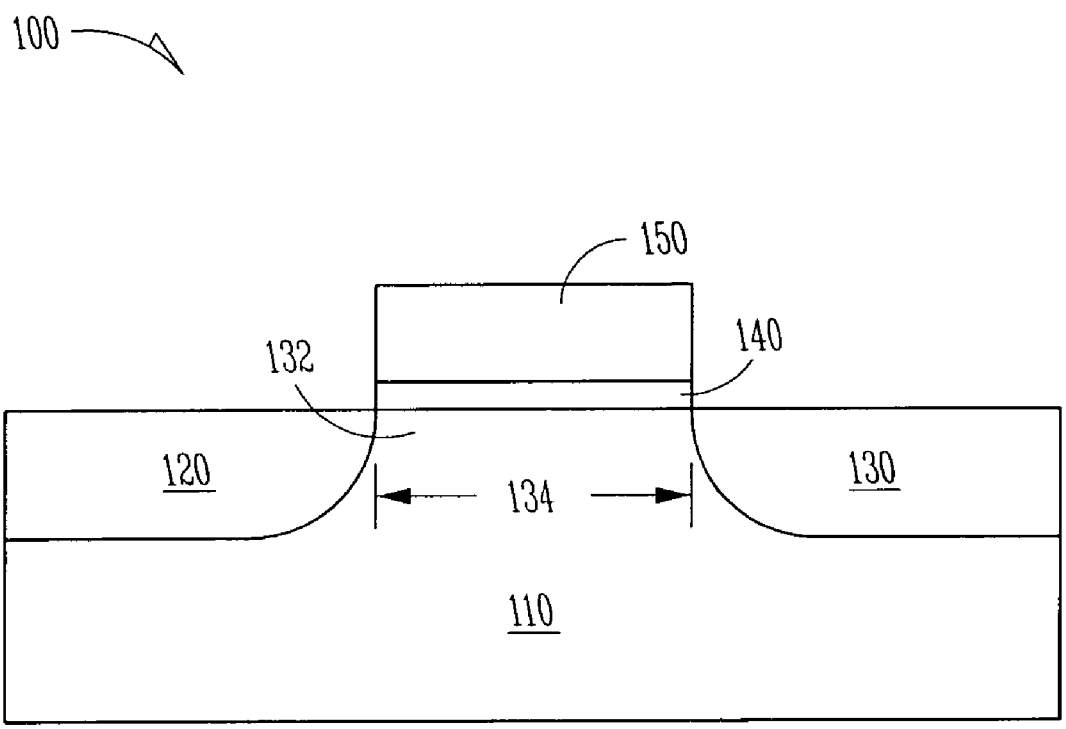
FIG. 1 shows a common configuration of a transistor in which an embodiment of a gate dielectric can be formed, according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of $SiO_2$, $\kappa_{ox}=3.9$, associated with $t_{eq}$, as $$t = (\kappa/\kappa_{ox}) t_{eq} = (\kappa/3.9) t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO2} + (\kappa_{ox}/\kappa) t.$$

Thus, if a SiO$_2$ layer is formed in the process, the t$_{eq}$ is again limited by a SiO$_2$ layer. In the event that a barrier layer is formed between the silicon layer and the desired dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

In a recent article by G. D. Wilk et al., *Journal of Applied Physics*, vol. 89: no. 10, pp. 5243-5275 (2001), material properties of high dielectric materials for gate dielectrics were discussed. In this article, a number of oxides were identified as possible candidates to replace SiO$_2$ as a gate dielectric. The list of possible candidates included the following:

| Material | Dielectric Constant (κ) | Band gap E$_g$ (eV) | Crystal Structure(s) |
|---|---|---|---|
| SiO$_2$ | 3.9 | 8.9 | Amorphous |
| Si$_3$N$_4$ | 7 | 5.1 | Amorphous |
| Al$_2$O$_3$ | 9 | 8.7 | Amorphous |
| Y$_2$O$_3$ | 15 | 5.6 | Cubic |
| La$_2$O$_3$ | 30 | 4.3 | Hexagonal, Cubic |
| Ta$_2$O$_3$ | 26 | 4.5 | Orthorhombic |
| TiO$_2$ | 80 | 3.5 | Tetrag. (rutile, anatase) |
| HfO$_2$ | 25 | 5.7 | Mono., Tetrag., Cubic |
| ZrO$_2$ | 25 | 7.8 | Mono., Tetrag., Cubic |

One of the advantages using SiO$_2$ as a gate dielectric has been that the formation of the SiO$_2$ layer results is an amorphous gate dielectric. Having an amorphous structure for a gate dielectric avoids high leakage paths associated with grain boundaries in polycrystalline gate dielectrics. Additionally, grain size and orientation changes throughout a polycrystalline gate dielectric can cause variations in the film's dielectric constant. From above, the materials having the advantage of a high dielectric constants relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

Based solely on the size of the dielectric constant, titanium oxide, TiO$_2$, appears to be an excellent candidate for replacing SiO$_2$. However, TiO$_2$ does not provide the electrical properties generally desired for integrated circuits, such as, high electric field breakdown and low leakage current. Dielectric films substituting various cations into amorphous TiO$_x$ films by magnetron sputtering were found to provide improved electric field breakdown and leakage current with respect to undoped TiO$_2$ films. See, R. B. Dover, *Applied Physics Letters*, vol. 74: no. 20, pp. 3041-3043 (2001).

However, another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

An embodiment of the teachings of the present invention includes dielectric films containing TiO$_x$ doped with a lanthanide formed by ion assisted electron beam evaporation followed by plasma oxidation. Dielectric films formed on a substrate in such a manner will have a surface that is smoother than a film formed in another fashion such as sputtering. This increased smoothness, or decreased roughness, is due in part to the use of high purity target materials for evaporation. Further, with ion bombardment during deposition by electron beam evaporation, additional energy is provided for activation at the deposition interface to provide for increased packing density of the dielectric film. As a result of the ion bombardment during deposition, the dielectric film is not only smoother, but is more durable in a humid environment. In addition, oxidation in a microwave-excited plasma system using a radial line slotted antenna provides for the formation of a uniform oxide layer.

In accordance with an embodiment of the present invention, a method of forming a dielectric film includes evaporating a Ti source at a first rate to deposit Ti on a substrate, evaporating a lanthanide source at a second rate to deposit a lanthanide on the substrate, controlling the first rate and the second rate to form a lanthanide doped Ti film (a Ti/lanthanide film), and oxidizing the Ti/lanthanide film to grow a dielectric film on a substrate, where the dielectric film contains TiO$_x$ doped with the lanthanide. In one embodiment, the lanthanide includes evaporating a lanthanide selected from a group consisting of Nd, Tb, and Dy.

In one embodiment, the Ti and the lanthanide are evaporated using electron beam evaporation. In another embodiment, the evaporation of Ti and lanthanide is assisted by ion beam bombardment of the substrate surface during deposition. The evaporation of the Ti and the lanthanide is followed by oxidation using a Kr/oxygen plasma.

A gate dielectric formed as a dielectric film containing lanthanide doped TiO$_x$ has a larger dielectric constant than silicon dioxide, a relatively small leakage current, and good stability with respect to a silicon based substrate. Embodiments according to the teachings of the present invention include forming transistors, capacitors, memory devices, and electronic systems having dielectric layers containing lanthanide doped TiO$_x$. Other embodiments include structures for transistors, capacitors, memory devices, and electronic systems with gate dielectrics containing lanthanide doped TiO$_x$. Such gate dielectrics provide a significantly thinner equivalent oxide thickness compared with a silicon oxide gate having the same physical thickness. Alternatively, such gate dielectrics provide a significantly thicker physical thickness than a silicon oxide gate dielectric having the same equivalent oxide thickness.

Figure 2:
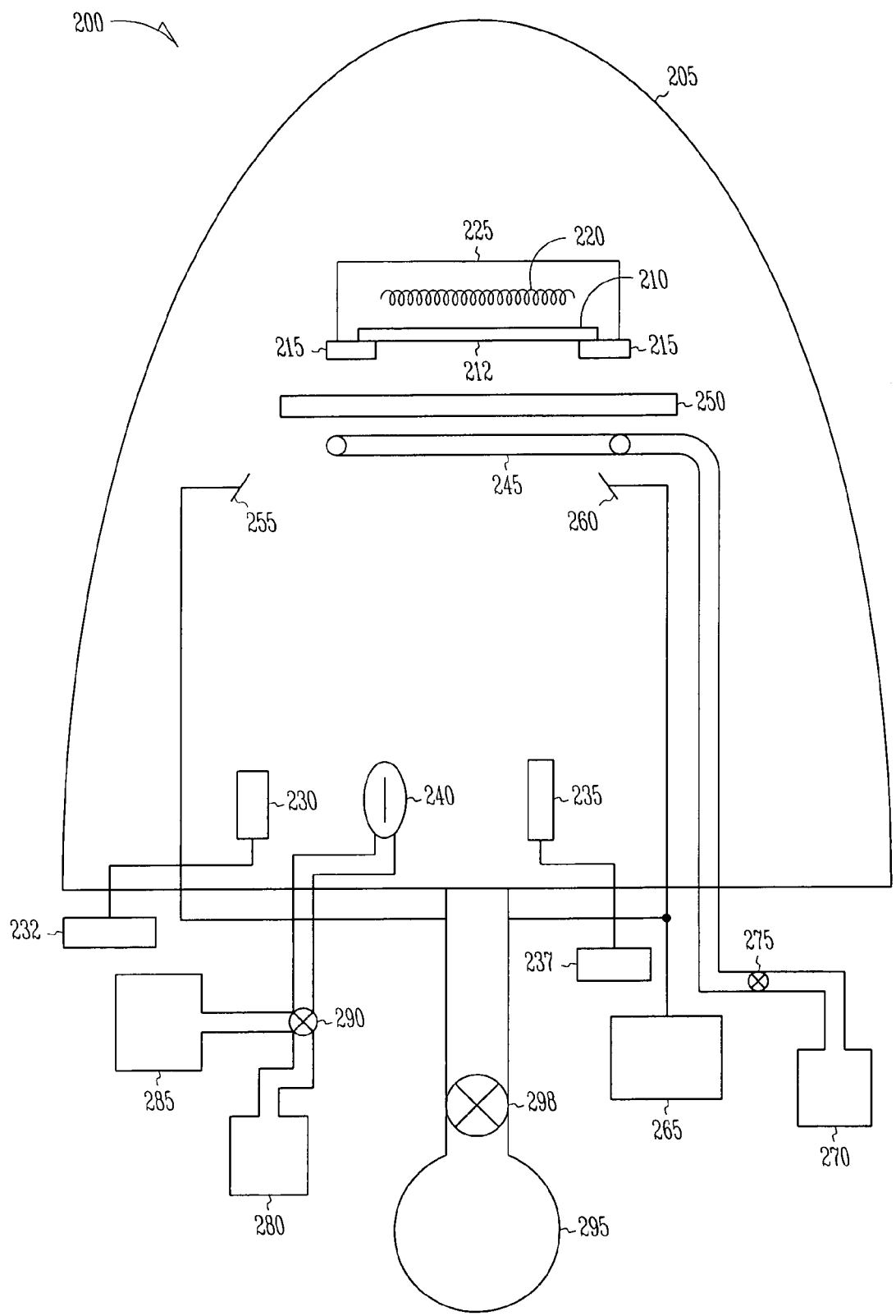
FIG. 2 illustrates an embodiment of an evaporation system for forming a film containing Ti doped with a lanthanide, according to the teachings of the present invention.

FIG. 2 illustrates an embodiment of an evaporation system 200 for forming a film containing Ti doped with a lanthanide, according to the teachings of the present invention. Evaporation system 200 includes a reaction chamber 205 in which is located a substrate 210 having a surface 212 that is to be processed. Substrate 210 rests on substrate holder 215 and its temperature can be raised above room temperature using a heater 220 with its associated reflector 225. Evaporation system 200 also includes a first electron gun device 230 regulated by electron gun controller 232 and a second electron gun device 235 regulated by electron gun controller 237 for depositing material on substrate surface 212. To assist in the deposition of material onto substrate surface 212, an ion gun 240 is provided in evaporation system 200.

Material evaporated using the electron gun devices 230, 235 and ions from ion gun 240 travel to substrate 210 through an ionizer ring 245 and shutter 250. Ionizer ring 245 provides supplemental oxygen for processes that require additional oxygen due to lost of oxygen in the evaporation of target materials. For target materials substantially void of oxygen, ionizer ring 245 provides initial oxygen to a film deposited on substrate surface 212 that is to undergo a subsequent oxidation process. Shutter 250 is used in conjunction with the control of electron gun devices 230, 235 to control the growth rate of a film on substrate 210. The growth rate is determined using quartz crystal monitors 255, 260. The quartz crystal monitors 255, 260 are coupled to a thickness/rate control 265, typically located outside reaction chamber 205.

Also located outside reaction chamber 205 is the ozone gas source 270 including a mass-flow controller 275, and an ion gas source 280. Mass-flow controller 275 controls the flow of ozone into reaction chamber 205. Gas for the ion gun 240 is controlled by an ion gun controller 285 including a mass-flow controller 290. Further, a vacuum pump 295 with mass flow controller 298 maintains the overall atmosphere of evaporation system 200 at desired levels prior to, during, and after evaporation.

Electron gun device 230 can include an electron gun and receptacle for a target material that is to be evaporated. Target material placed in the target receptacle of electron gun device 230 is heated by impact from an electron beam from its associated electron gun. The electron beam is generated with an intensity and duration with which to evaporate the material in the target receptacle of electron gun device 230. The evaporated material then distributes throughout the reaction chamber 205. The evaporated material and pre-evaporation contaminants are prevented from depositing on substrate surface 212 in an unwanted manner by shutter 250. Electron gun device 235 is similar to electron gun device 235. In one embodiment, these devices can incorporate multiple target receptacles. Further, electron gun devices 230, 235 can be realized using commercially available devices as are known to those skilled in the art.

Ion gun 240 is a typical ion gun as is known in the art. In one embodiment, ion gun 240 provides an ion beam with an incident angle that is within +40° to −40° relative to the substrate surface 212. In one embodiment, ion gun 240 is a filament-type ion gun with a relatively large diameter ranging from 7.6 cm to 10 cm, which uses a hot filament to ionize gas from gas source 280. Alternately, a cold catheter discharge gun can be used. Commercial ion guns are available as is known to those skilled in the art. Ion gun 240 regulated by ion gun controller 285 provides ions that are directed at the substrate surface 212. The impact of the ions provides activation energy for the formation of a dielectric film as evaporated material interacts with substrate surface 212. In addition, to passing through an opened shutter 250, the ions also pass through ionizer ring 245 as they travel to substrate surface 212.

Ionizer ring 245 provides oxygen necessary to compensate for loss of oxygen in the evaporated target material, or to add initial oxygen for subsequent oxidation processing. In one embodiment, it includes a ring with a center axis. The ring has a plurality of openings adapted to direct ozone flowing to ionizer ring 245 from ozone gas source 270 towards substrate surface 212. Ozone is uniformly distributed to substrate surface 212 by ionizer ring 245 positioned generally parallel to substrate 210. Further, ionizer ring 245 has a size that does not inhibit the ion beam directed at substrate surface 212.

An evaporation system is described in co-pending, commonly assigned U.S. patent application: entitled "Formation of Metal Oxide Gate Dielectric,", Ser. No. 09/779,959, which is incorporated herein by reference. The use, construction and fundamental operation of reaction chambers for deposition of films are understood by those of ordinary skill in the art of semiconductor fabrication. The embodiments of the present invention can be practiced on a variety of such reaction chambers without undue experimentation. Furthermore, one of ordinary skill in the art will comprehend the necessary detection, measurement, and control techniques in the art of semiconductor fabrication upon reading the disclosure.

Evaporation system 200 can be used to evaporate oxide material or non-oxygen material. When forming a dielectric film containing an oxide from the evaporation of a substantially pure metal, evaporation system 200 is used in conjunction with another system for oxidizing a metallic film formed on a substrate in evaporation system 200. Such a oxidation system that can be used following processing in evaporation system 200 is a plasma oxidation system.

Figure 3:
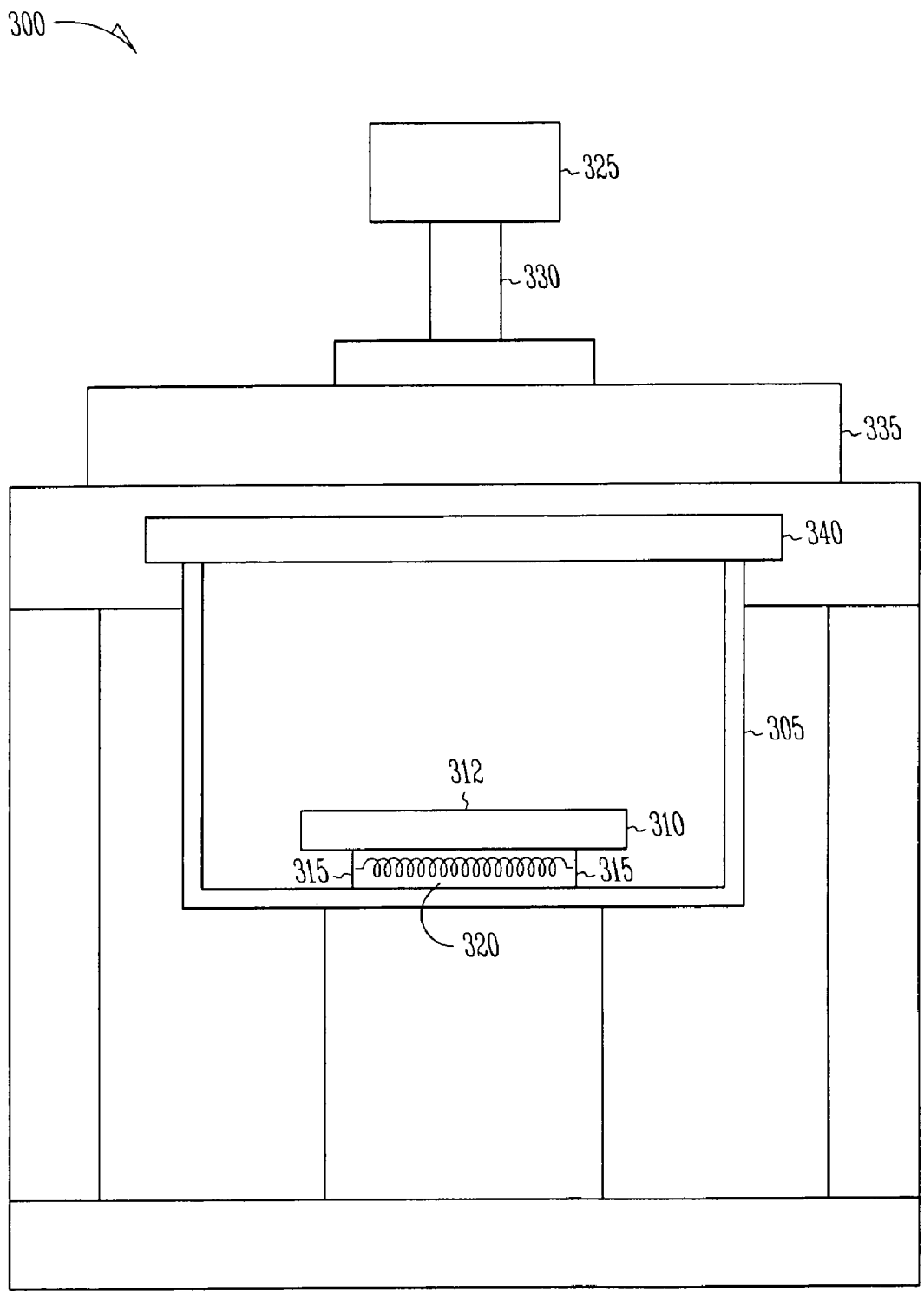
FIG. 3 illustrates an embodiment of a plasma oxidation system for forming a dielectric film containing lanthanide doped $TiO_x$, according to the teachings of the present invention.

FIG. 3 illustrates an embodiment of a plasma oxidation system 300 for forming a dielectric film containing lanthanide doped $TiO_x$, according to the teachings of the present invention. Plasma oxidation system 300 includes a reaction chamber 305 in which is located a substrate 310 having a surface 312 that is to be processed. Substrate 310 rests on substrate holder 315 and its temperature can be raised above room temperature using a heater 320. Plasma oxidation system 300 also includes a microwave generator 325, a co-axial waveguide 330, a radial line slot antenna 335, and a microwave radiation plate 340 for generating a microwave excited plasma. To focus on the use of plasma oxidation system 300 in the various embodiments of the present invention, detailed elements of the plasma oxidation system are not shown. For example, gas inlets, vacuum ports, and various control apparatus, as are known to those skilled in the art, are not shown.

Plasma oxidation system 300 provides circularly polarized microwaves that emanate from radial line slot antenna 335, having been generated by microwave generator 325 and transmitted through co-axial waveguide 330. The microwaves interact with gases to produce a plasma. An oxidation process using this system employs a mixture of oxygen an inert gases. Typically, the gas mixture can include an oxygen concentration from about 2% to about 4% by volume of the gas mixture. Suitable inert gases can include krypton and helium. Microwave interaction is effective to form atomic oxygen that can readily interact with the surface 312 of a substrate 310. Further, use of a radial line slot antenna gives rise to superior uniformity of the oxide across substrate surface 312 as well as high plasma density and low electron temperature.

A plasma oxidation system is described in co-pending, commonly assigned U.S. patent application: entitled "Methods for Forming Dielectric Materials and Methods for Forming Semiconductor Devices," Ser. No. 09/908,767, which is incorporated herein by reference. The use, construction and fundamental operation of a plasma oxidation system for forming oxide films are understood by those of ordinary skill in the art of semiconductor fabrication. The embodiments of the present invention can be practiced on a variety of such plasma oxidation systems without undue experimentation. Furthermore, one of ordinary skill in the art will comprehend the necessary detection, measurement, and control techniques in the art of semiconductor fabrication upon reading the disclosure.

These elements of evaporation system 200 and plasma oxidation system 300 can be controlled by a computer. To focus on the use of evaporation system 200 and plasma oxidation system 300 in the various embodiments of the present invention, the computer is not shown. Those skilled in the art can appreciate that the individual elements such as pressure control, temperature control, deposition rate control, electron gun operation, ion gun operation, and microwave generation within evaporation system 200/plasma oxidation system 300 can be under computer control. In one embodiment, instructions stored in a computer readable medium are executed by a computer to accurately control the integrated functioning of the elements of evaporation system 200/plasma oxidation system 300 to form a dielectric film containing $TiO_x$ doped with a lanthanide.

Figure 4:
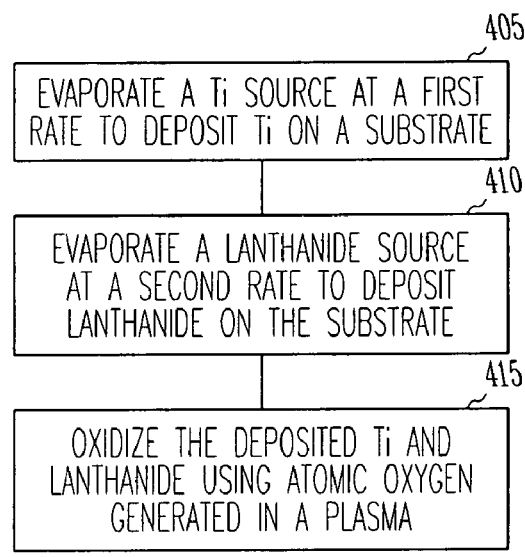
FIG. 4 illustrates a flow diagram of elements for an embodiment of a method for processing a dielectric film containing lanthanide doped $TiO_x$, according to the teachings of the present invention.

FIG. 4 illustrates a flow diagram of elements for an embodiment of a method for processing a dielectric film containing lanthanide doped $TiO_x$, according to the teachings of the present invention. In this embodiment, a method of forming a dielectric film includes evaporating a Ti source at a first rate to deposit Ti on a substrate, at block 405, evaporating a lanthanide source at a second rate to deposit lanthanide on the substrate, at block 410, and oxidizing the deposited Ti and lanthanide using atomic oxygen generated in a plasma, at block 415. In one embodiment, the lanthanide is selected from a group consisting of Nd, Tb, and Dy.

In one embodiment, Ti is evaporated by electron beam evaporation. Additionally, the lanthanide can also be evaporated using electron beam evaporation. Alternately, the Ti and/or the lanthanide can be evaporated by other processes including thermal evaporation. Also, during evaporation of the Ti and the lanthanide, the substrate surface is bombarded with ions to facilitate the deposition of the Ti and the lanthanide. Argon ions can be used in the ion bombardment, or alternately xenon ions.

The Ti and the lanthanide can be evaporated at substantially the same time with different rates of evaporation to insure that a film formed on a substrate surface has lanthanide dispersed throughout the film prior to oxidizing with a plasma. In one embodiment, oxidizing with a plasma can be accomplished with atomic oxygen generated in a Krypton/oxygen plasma. Alternately, the plasma can be generated using helium.

In one embodiment, prior to the plasma oxidation process, oxygen is supplied during the evaporation of the Ti and the lanthanide to provide a small seed amount of oxygen into the film prior to oxidation. This initial supply of oxygen is provided using an ionizer ring. Alternately, the ionizer ring is effectively turned off to provide a substantially oxygen free film for plasma oxidation.

In an embodiment, the first rate for evaporating Ti and the second rate for evaporating lanthanide is controlled to provide a film containing Ti doped with a predetermined percentage of the lanthanide. In one embodiment, the Ti film can be doped in the range from about 10% to about 30% of lanthanide. Subsequently, oxidizing the Ti/lanthanide film produces a dielectric film doped in the range from about 5% to about 40% of lanthanide. Further, controlling the first and second rate allows the dielectric film to be formed having a dielectric constant ranging from about 50 to about 110.

Figure 5:
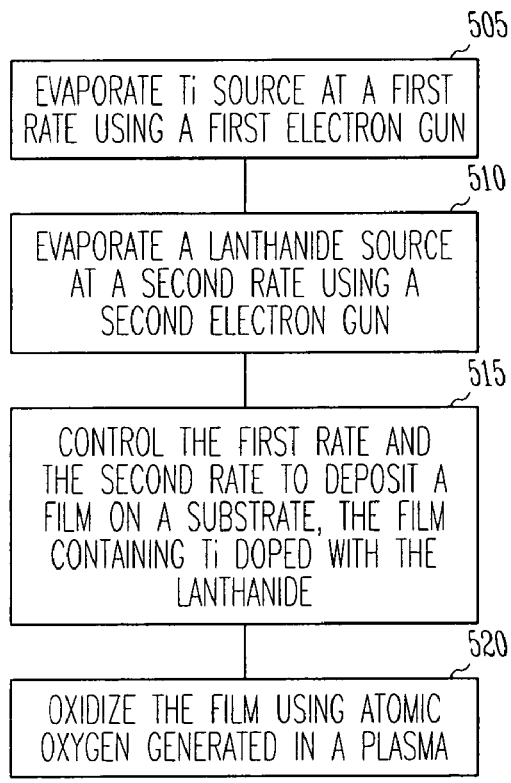
FIG. 5 illustrates a flow diagram of elements for an embodiment of a method for processing a dielectric film containing lanthanide doped $TiO_x$ using electron beam evaporation followed by plasma oxidation, according to the teachings of the present invention.

FIG. 5 illustrates a flow diagram of elements for an embodiment of a method for processing a dielectric film containing lanthanide doped $TiO_x$ using electron beam evaporation followed by plasma oxidation, according to the teachings of the present invention. In this embodiment, a method of forming a dielectric film includes evaporating a Ti source at a first rate using a first electron gun, at block 505, evaporating a lanthanide source at a second rate using a second electron gun, at block 510, controlling the first rate and the second rate to deposit a film on a substrate, the film containing Ti doped with the lanthanide, at block 515, and oxidizing the film material using atomic oxygen generated in a plasma, at block 520. An embodiment of this method can be realized using evaporation system 200 of FIG. 2 and plasma oxidation system 300 of FIG. 3.

An embodiment of a formation of a lanthanide doped $TiO_x$ dielectric film includes forming such a film as a gate dielectric of a transistor. Evaporation system 200 is prepared by locating a substrate 210 on substrate holder 215. Substrate 210 is a material used for forming a transistor such as a silicon or silicon containing material. In other embodiments, germanium, gallium arsenide, silicon-on-sapphire substrates, or other suitable substrates may be used. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 205 to undergo an ion assisted electron beam evaporation process.

Evaporation system 200 is also prepared by loading a Ti target, or Ti source, into electron gun device 230 and loading a lanthanide target, or lanthanide source, into electron gun device 235. The lanthanide is used to provide a dopant for a $TiO_x$ film to be grown on substrate surface 212. The lanthanide can be selected from a group consisting of Nd, Tb, and Dy. In one embodiment, the Ti source can include Ti slugs, where the Ti slugs are at least 99.9999% pure. The lanthanide source can include a lanthanide that is at least 99.999% pure. Typically, the lanthanide dopant source material can be in the form of a powder. In other embodiments, other materials of varying degrees of purity can be used as a dopant in an amorphous $TiO_x$ film. Additionally, a Ti source of less purity can also be used in an embodiment.

Reaction chamber 205 is evacuated to a low pressure to maintain the substrate surface clean and in condition for processing. In one embodiment, reaction chamber is brought to and maintained at a pressure of about $2 \times 10^{-7}$ Torr prior to evaporating the Ti target and evaporating the lanthanide target. While, in one embodiment, during the evaporation process, reaction chamber 205 is maintained at a pressure of about $2 \times 10^{-6}$ Torr during deposition. The pressure in reaction chamber 205 is controlled by vacuum pump 295 through mass-flow controller 298.

The environment of reaction chamber 205 is further prepared by raising the temperature of substrate 210 using heater 220 and its associated reflector 225. In one embodiment, the substrate temperature is raised to and maintained at a temperature ranging from about 100° C. to about 200° C. prior to and during the formation of the film containing Ti and the lanthanide.

Once the desired environmental conditions fo reaction chamber 205 have been attained, the evaporation process can begin. Electron gun device 230, regulated by electron gun controller 232, evaporates Ti into reaction chamber 205 where it is distributed throughout. During the Ti evaporation, the selected lanthanide is evaporated using electron gun device 235 regulated by electron gun controller 237, comingling the evaporated lanthanide with the evaporated Ti. The evaporated material is deposited on substrate surface 212. The rates for forming the layer of Ti and lanthanide grown on substrate surface 212 is regulated using thickness/rate control 265 that receives growth information from quartz crystal monitors 255, 260.

Alternately, the Ti evaporation and the lanthanide can be performed with one electron gun device having multiple target receptacles that can be shielded from each other. The electron gun device can further include either two electron guns individually controlled or one electron gun whose electron beam can be multiply controlled providing two beams directed individually in two directions. In such cases, the electron gun device acts as two electron guns, where one generated beam defines a first electron gun and a second generated beam defines a second electron gun.

During the Ti and lanthanide evaporation, oxygen can be supplied at the substrate surface 212 by ionizer ring 245. Ozone is supplied from ozone gas source 270 with flow controlled by mass-flow controller 275 through the openings in ionizer ring 245. In one embodiment, the partial pressure of ozone in reaction chamber 205 is in the range of about $2 \times 10^{-5}$ torr to about $8 \times 10^{-5}$ torr. Parameters for ozone partial pressure can be determined from measuring oxygen content in the deposited film using the quartz crystal monitors 255, 260. The oxygen can be supplied to provide an initial amount of oxygen dispersed throughout the lanthanide doped Ti film (the Ti/lanthanide film) to assist subsequent plasma oxidation. Alternately, the ozone flow can be maintained in an off state to provide a Ti/lanthanide film that is substantially oxygen free prior to plasma oxidation.

Evaporation of the Ti and the lanthanide including supplementing with oxygen provides the initial start material for forming an amorphous $TiO_x$ dielectric layer doped with the lanthanide. To assist in the formation of this dielectric layer, substrate surface is bombarded with argon ions. The ion bombardment is initiated shortly after beginning the evaporation process so that at least an initial monolayer or so of Ti doped with the lanthanide is formed. In one embodiment, an argon beam is directed at substrate surface 212 at about one to two seconds after the evaporation process is initiated. Ion gun controller 285 regulates the flow of argon gas through mass-flow controller 290 providing an argon beam density in the range of about 0.5 ma/cm$^2$ to about 1 ma/cm$^2$. In other embodiments, inert gases used in the ion beam process can include xenon and krypton at various beam densities.

Use of the electron gun controllers 232, 237 in conjunction with thickness/rate control 265 allows the Ti to be evaporated at a first rate, and the lanthanide to be evaporated at a second rate. By controlling the first rate and the second rate, a lanthanide doped Ti film can be formed on substrate surface 212 with the Ti film doped in the range from about 10% to about 30% of the lanthanide. Controlling the evaporation rates allows the lanthanide to be selectively doped in the Ti film within a predetermined range for the percentage of the lanthanide in the film. Further processing to form an oxide results in a dielectric film of $TiO_x$ doped with the lanthanide, where the dielectric film can be selectively grown, doped in the range from about 5% to about 40% of the lanthanide. Further, controlling the first rate and the second rate provides for growing on substrate 210 an amorphous $TiO_x$ film doped with a lanthanide, where the dielectric film has a dielectric constant ranging from about 50 to about 110. The first evaporation rate can also be controlled such that the Ti can be evaporated at a rate ranging from about 0.2 nm/sec to about 0.5 nm/sec. Additionally, the second rate can be controlled such that the lanthanide is evaporated at a rate ranging from about 0.2 nm/sec to about 0.5 nm/sec.

Once the Ti film doped with a lanthanide is formed on the substrate 210, the film is processed by plasma oxidation. The plasma oxidation system 300 of FIG. 3 can be included as part of an overall processing system including evaporation system 200 of FIG. 2. To avoid contamination of the surface of the Ti/lanthanide film, plasma oxidation system 300 can be connected to evaporation system 200 using sealable connections to maintain the substrate, which is substrate 210 in FIG. 2 and substrate 310 of FIG. 3, in an appropriate environment between Ti/lanthanide evaporation processing and plasma oxidation. Other means as are known to those skilled in the art can be employed for maintaining an appropriate environment between different processing procedures.

Figure 6A:
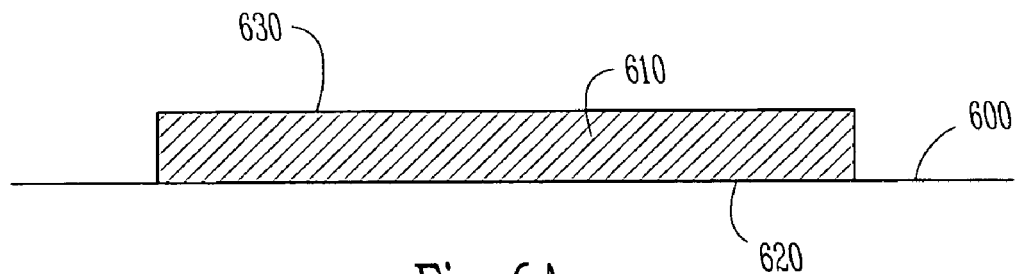
FIG. 6A shows an embodiment of a layer of Ti doped with a lanthanide deposited on a substrate, according to the teachings of the present invention.
Figure 6B:
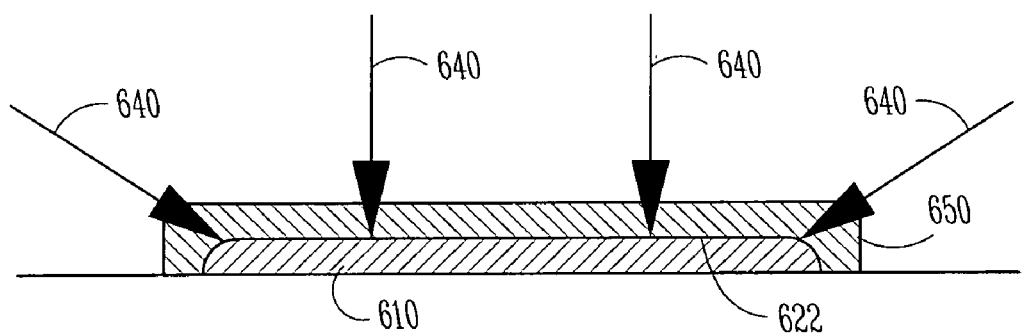
FIG. 6B shows an embodiment of a partially oxidized Ti layer doped with lanthanide on a substrate, according to the teachings of the present invention.
Figure 6C:
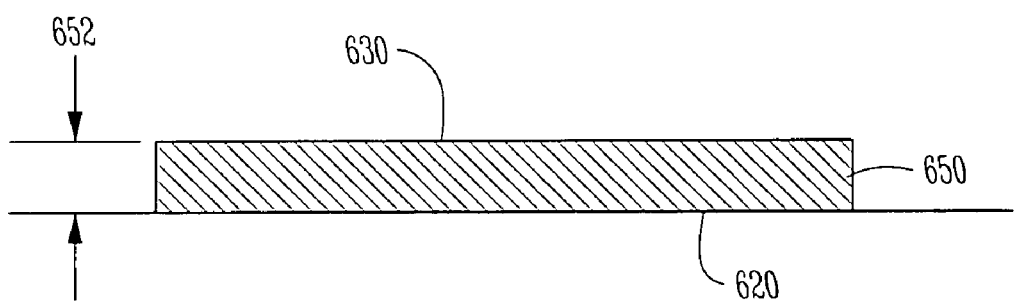
FIG. 6C shows an embodiment of a lanthanide doped $TiO_x$ film substantially completely oxidized and formed on a substrate, according to the teachings of the present invention.

FIGS. 6A-6C show a low temperature plasma oxidation process using plasma oxidation system 300 of FIG. 3 in one embodiment to form a layer of lanthanide doped $TiO_x$. FIG. 6A shows an embodiment of a Ti/lanthanide layer 610 deposited on a substrate 600 having an substrate interface 620, according to the teachings of the present invention. Ti/lanthanide layer 610 is deposited on substrate 600 by electron beam evaporation, as discussed above, providing a film with an outer surface 630. Layer 610 is deposited over a body region of a transistor, however the layers may be deposited on any surface within the scope of the invention.

FIG. 6B shows an embodiment of a partially oxidized Ti/lanthanide layer 650 on substrate 600, according to the teachings of the present invention. In FIG. 6B, the Ti/lanthanide layer 610 is in the process of being oxidized. In one embodiment, the oxidation process includes a krypton/oxygen mixed plasma oxidation process. The mixed plasma process generates atomic oxygen or oxygen radicals in contrast to molecular oxygen or $O_2$ used in conventional thermal oxidation. The atomic oxygen is introduced to the layer from all exposed directions as indicated by arrows 640, creating an oxide portion 650. The atomic oxygen continues to react with the layer and creates an oxidation interface 622. As the reaction progresses, atomic oxygen diffuses through the oxide portion 650 and reacts at the oxidation interface 622 until the layer is completely converted to an oxide of the deposited material layer.

FIG. 6C shows an embodiment of a lanthanide doped $TiO_x$ substantially completely oxidized and formed on substrate 600, according to the teachings of the present invention. FIG. 6C shows the resulting oxide layer 650 which spans a physical thickness 652 from the outer surface 630 to the interface 620. The overall thickness 652 of the lanthanide doped $TiO_x$ layer in FIG. 6C has increased from that of the Ti/lanthanide layer deposited on substrate 600 in FIG. 6A, due to the oxidation of the Ti/lanthanide layer.

In an embodiment, the processing variables for the mixed plasma oxidation include a low ion bombardment energy of less than about 7 eV, a high plasma density above $10^{12}/cm^3$ and a low electron temperature below about 1.3 eV. In another embodiment, the substrate temperature is maintained at about 400° C. In another embodiment, a mixed gas consisting of krypton and oxygen with the oxygen content at 3% is used at a pressure of about 1 Torr. In one embodiment, microwaves having a frequency of about 8.3 GHZ and a power density of about 4 W/cm$^2$ are used. The oxidation process can provide a growth rate of about 1.5 nm/min.

The low temperature mixed plasma oxidation process described above allows the deposited layer to be oxidized at a low temperature. The mixed plasma process in one embodiment is performed at approximately 400° C. in contrast to prior thermal oxidation processes that are performed at approximately 1000° C.

A dielectric film of $TiO_x$ doped with the lanthanide can be selectively grown with lanthanide doping in the range from about 5% to about 40% of the lanthanide. Further, controlling the first rate and the second rate of evaporation followed by oxidation by a Kr/oxygen plasma provides for growing on substrate 210 an amorphous $TiO_x$ film doped with a lanthanide, where the dielectric film has a dielectric constant ranging from about 50 to about 110.

In another embodiment, a method for forming a lanthanide doped $TiO_x$ dielectric film includes evaporating a Ti source at a first rate using a first electron gun, evaporating a lanthanide source at a second rate using a second electron gun, controlling the first rate and the second rate to deposit a film on a substrate, bombarding a surface of the substrate with ions during evaporation of the Ti and the lanthanide, and oxidizing the film using atomic oxygen generated in a plasma, wherein the dielectric film contains lanthanide doped $TiO_x$. The lanthanide can be selected from a group consisting of Nd, Tb, and Dy. In one embodiment, the dielectric film is grown with a predetermined percentage of lanthanide doping. After an initial waiting period, bombarding substrate surface 212 with ions during the Ti evaporation and/or the lanthanide evaporation includes bombarding substrate surface 212 during any part of the Ti and the lanthanide evaporation process. The various operating parameters of the embodiments discussed above can be realized in further embodiments that do not use an ionizer ring to supplement the substrate surface with oxygen.

In another embodiment, a method for forming a lanthanide doped $TiO_x$ dielectric film includes evaporating a Ti source at a first rate using a first electron gun, evaporating a lanthanide source at a second rate using a second electron gun, controlling the first rate and the second rate to deposit a film on a substrate, supplementing with oxygen using an ionizer ring during the deposition of the Ti and the lanthanide, and oxidizing the film using atomic oxygen generated in a plasma, where the dielectric film contains lanthanide doped $TiO_x$. The lanthanide can be selected from a group consisting of Nd, Tb, and Dy. In one embodiment, the dielectric film is grown with a predetermined percentage of lanthanide doping. The various operating parameters of the embodiments discussed above can be realized in further embodiments that do not use ion assistance in the formation of the Ti/lanthanide film.

The lanthanide doped $TiO_x$ dielectric layer grown according to these various embodiments will provide smoother surfaces than expected from other current methods, which translates to higher breakdown electric fields and lower leakage currents. Additionally, the oxide formation across the substrate is more uniform than with other methods.

Figure 7:
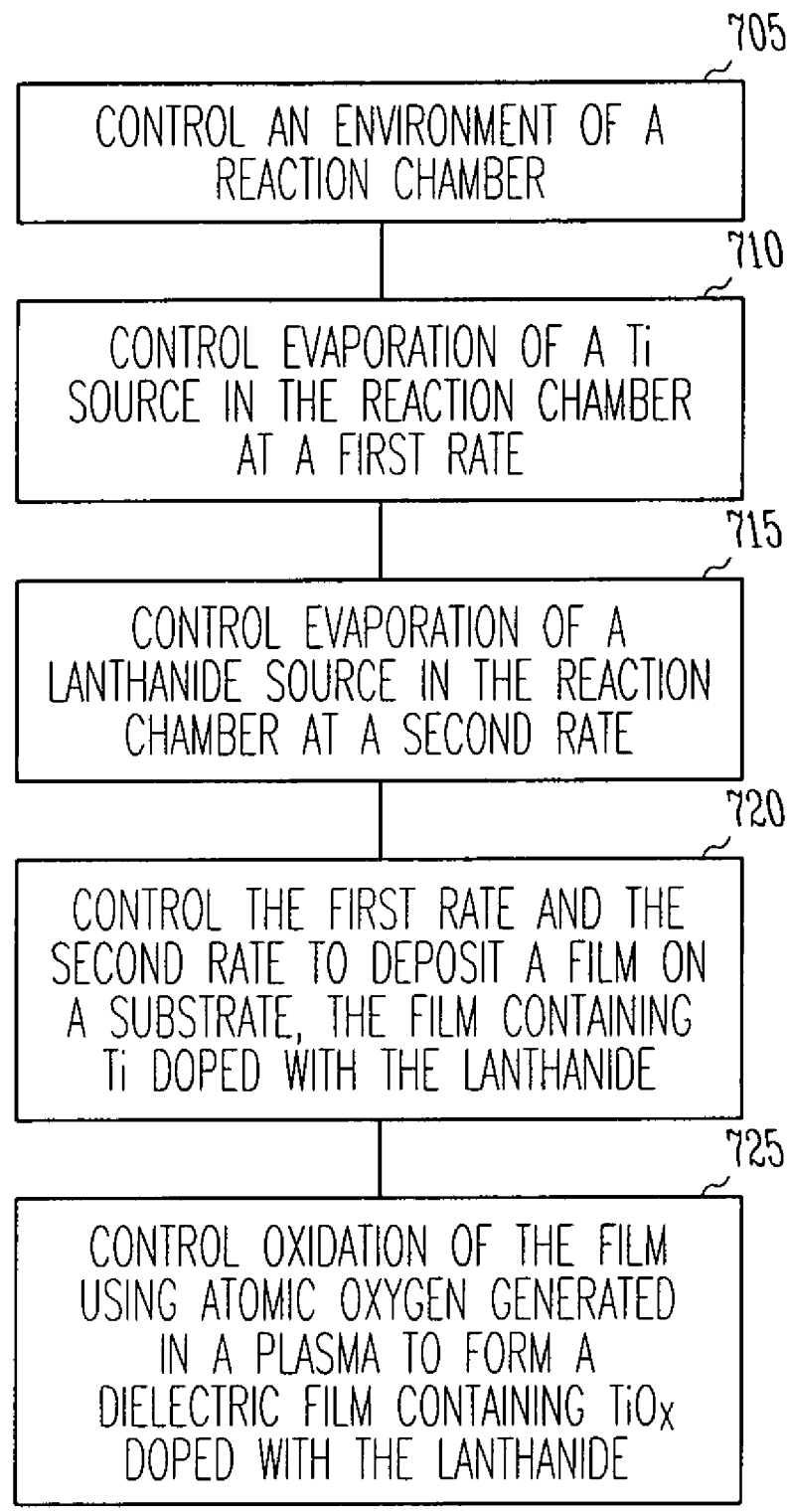
FIG. 7 illustrates a flow diagram of elements for an embodiment of a computerized method for processing a dielectric film containing lanthanide doped $TiO_x$, according to the teachings of the present invention.

FIG. 7 illustrates a flow diagram of elements for an embodiment of a computerized method to process a dielectric film containing lanthanide doped $TiO_x$, according to the teachings of the present invention. In this embodiment, a computerized method of forming a dielectric film includes controlling an environment of a reaction chamber, at block 705, controlling evaporation of a Ti source in the reaction chamber at a first rate, at block 710, controlling evaporation of a lanthanide source in the reaction chamber at a second rate, at block 715, controlling the first rate and the second rate to deposit a film on a substrate, where the film contains Ti doped with the lanthanide, at block 720, and controlling oxidation of the film using atomic oxygen generated in a plasma to form a dielectric film containing $TiO_x$ doped with the lanthanide, at block 725. Controlling the evaporation rates allows the lanthanide to be selectively doped into the Ti film within a predetermined range for the percentage of the lanthanide in the film. An embodiment of this method can be realized using evaporation system 200 of FIG. 2 and plasma oxidation system 300 of FIG. 3, where the controls for the individual elements of evaporation system 200 and the individual elements of plasma oxidation system 300 are coupled to a computer, not shown in FIG. 200 or FIG. 300.

The computer provides control of the Ti evaporation by regulating the operation of electron gun device 230 by controlling electron gun control 232. Likewise, the computer provides control of the lanthanide evaporation by regulating the operation of electron gun device 235 by controlling electron gun control 237. Further, the computer can control ion gun controller 285 and mass-flow controller 290 to regulate the ion beam generated by ion gun 240. In addition, the computer can regulate supplementing oxygen at substrate surface 212 by regulating the amount of ozone directed to ionizer 245 by controlling the mass-flow controller 275.

The computer can also control the environment of reactor chamber 205 in which a film is being formed on substrate 210. The computer regulates the pressure in reaction chamber 205 within a predetermined pressure range by controlling vacuum pump 295 and mass-flow controller 298. The computer also regulates the temperature range for substrate 210 within a predetermined range by controlling heater 220. Further, the computer controls unwanted material from reaching the substrate surface 212 by controlling shutter 250.

Receiving information from thickness/rate control 265, and controlling electron gun devices 230, 235, ion gun 240, and ionizer 245, the computer controls a first rate for Ti evaporation and a second rate for lanthanide evaporation to selectively grow a Ti film doped in the range from about 10% to about 30% of the lanthanide. Further, the computer can control the first rate and the second rate such that subsequent oxidation results in the growth of an amorphous $TiO_x$ film doped with a lanthanide in the range of about 5% to about 40% of the lanthanide, where the $TiO_x$ film has a dielectric constant ranging from about 50 to about 110. The computer can also control the elements of evaporation system 200 to achieve the operating parameters as previously discussed in the embodiments for forming a Ti/lanthanide film.

Once the Ti/lanthanide film is processed, the substrate 210 of FIG. 2 becomes substrate 310 to be oxidized in the microwave excited plasma oxidation system 300 of FIG. 3. Further, as with evaporation system 200, in one embodiment, the elements of plasma oxidation system 300 are controlled by the computer that controls evaporation system 200. Alternately, plasma oxidation system 300 can be controlled by a separate computer.

The computer controls microwave generator 325 that supplies the microwaves in reaction chamber 305. It also regulates heater 320 to control the temperature of substrate 310. Though the gas inlets and vacuum ports with their associated mass-flow controllers are not shown in FIG. 3, these elements are regulated by the computer to control the plasma parameters and pressure in reaction chamber 305.

For convenience, the individual control lines to elements of evaporation system 200, and plasma oxidation system 300, as well as a computer, are not shown in FIGS. 2 and 3. The above descriptions of the computer control in conjunction with FIGS. 2, 3 provide information for those skilled in the art to practice embodiments for forming a dielectric layer containing lanthanide doped $TiO_x$ using a computerized method as described herein.

A computer for controlling the elements of evaporation system 200 of FIG. 2 and plasma oxidation system 300 of FIG. 3 operates under computer-executable instructions to perform a method for forming a dielectric film that can include controlling an environment of a reaction chamber, controlling evaporation of a Ti source in the reaction chamber at a first rate, controlling evaporation of a lanthanide source in the reaction chamber at a second rate, controlling the first rate and the second rate to deposit a film on a substrate, where the film contains Ti doped with the lanthanide, and controlling oxidation of the film using atomic oxygen generated in a plasma to form a dielectric film containing lanthanide doped $TiO_x$. Controlling the evaporation rates allows the lanthanide to be selectively doped into the Ti film within a predetermined range for the percentage of the lanthanide in the film. Using a computer to control parameters for growing the dielectric film provides for processing the dielectric film over a wide range of parameters allowing for the determination of an optimum parameter set for the evaporation system/plasma oxidation system used. The computer-executable instructions can be provided in any computer-readable medium. Such computer-readable medium includes, but is not limited to, floppy disks, diskettes, hard disks, CD-ROMS, flash ROMS, nonvolatile ROM, and RAM.

The embodiments described herein provide a process for growing a dielectric film having a wide range of useful equivalent oxide thickness, $t_{eq}$, associated with a dielectric constant in the range from about 50 to about 110. The $t_{eq}$ range in accordance with embodiments of the present invention are shown in the following:

| κ | Physical Thickness t = 1.0 nm (1.0 × 10¹ Å) $t_{eq}$ (Å) | Physical Thickness t = 5.0 nm (5.0 × 10¹ Å) $t_{eq}$ (Å) | Physical Thickness t = 100.0 nm (1 × 10³ Å) $t_{eq}$ (Å) | Physical Thickness t = 350 nm (3.5 × 10³ Å) $t_{eq}$ (Å) |
|---|---|---|---|---|
| 50 | 0.78 | 3.90 | 78.00 | 273.00 |
| 75 | 0.52 | 2.60 | 52.00 | 182.00 |
| 100 | 0.39 | 1.95 | 39.00 | 136.50 |
| 110 | 0.35 | 1.77 | 35.45 | 124.09 |

The relatively large dielectric constant for material layers of lanthanide doped $TiO_x$ allows for the engineering of dielectric films having a physical thickness in the 100 nm (1000 Å) range, while achieving a $t_{eq}$ of less than 100 Å. Further, growing ultra-thin layers, or films, of lanthanide doped $TiO_x$ provides for $t_{eq}$ in the range of several monolayers. From above, it is apparent that a film containing lanthanide doped $TiO_x$ can be attained with a $t_{eq}$ ranging from 1.5 Å to 5 Å. Further, such a film can provide a $t_{eq}$ significantly less than 2 or 3 Å, even less than 1.5 Å.

Further, dielectric films of lanthanide doped $TiO_x$ formed by ion assisted electron beam evaporation followed plasma oxidation can provide not only ultra thin $t_{eq}$ films, but also films with relatively low leakage current. In addition to using ion assisted electron beam evaporation, attainment of relatively low leakage current is engineered by doping with lanthanides selected from a group consisting of Nd, Tb, and Dy. Though a layer of undoped $TiO_x$ is typically amorphous, which assists the reduction of leakage current, evaporating these lanthanides during the evaporation of the Ti layer provides a layer for oxidation that subsequently yields a doped amorphous $TiO_x$ with enhanced leakage current characteristics. Leakage currents on the order of $10^{-7}$ A/cm² or smaller in $TiO_x$ layers doped with Nd, Tb, or Dy can be attained, which are orders of magnitude smaller than for undoped $TiO_x$. Further, the breakdown electric fields are several factors larger for layers of $TiO_x$ doped with Nd, Tb, or Dy than for layers of undoped $TiO_x$.

The doping of the $TiO_x$ layer with a lanthanide occurs as a substitution of a lanthanide atom for a Ti atom. The resultant doped $TiO_x$ layer is a layer of amorphous $Ti_{1-y}L_yO_x$, where L is a lanthanide. Controlling the evaporation of Ti, the evaporation of the selected lanthanide, and the plasma oxidation allows a $Ti_{1-y}L_yO_x$, or lanthanide doped $TiO_x$, dielectric layer to be formed where the lanthanide, L, can range from about 5% to about 40% of the dielectric layer formed. Such $TiO_x$ layers doped with Nd, Tb, or Dy formed by ion bean assisted electron beam evaporation followed by plasma oxidation can provide the reduced leakage current and increased breakdown electric fields mentioned above.

A transistor 100 as depicted in FIG. 1 can be formed by forming a source region 120 and a drain region 130 in a silicon based substrate 110 where the source region 120 and the drain region 130 are separated by a body region 132. The body region 132 separated by the source 120 and the drain 130 defines a channel having a channel length 134. Ti is evaporated using an electron gun at a controlled rate. A lanthanide selected from a group consisting of Nd, Tb, and Dy is evaporated using a second electron gun at a second controlled rate. Evaporating the lanthanide source is begun substantially concurrent with evaporating Ti, forming a film 140 containing Ti and lanthanide on the body region, while the body region is bombarded with Ar ions shortly after the deposition of Ti on the body region has begun. Film 140, or layer 140, is oxidized using a Kr/oxygen plasma. A gate is formed over the gate dielectric 140. Typically, forming the gate includes forming a polysilicon layer, though a metal gate can be formed in an alternative process. Forming the substrate, source region, drain region, and the gate is performed using standard processes known to those skilled in the art. Additionally, the sequencing of the various elements of the process for forming a transistor is conducted with standard fabrication processes, also as known to those skilled in the art.

Figure 8:
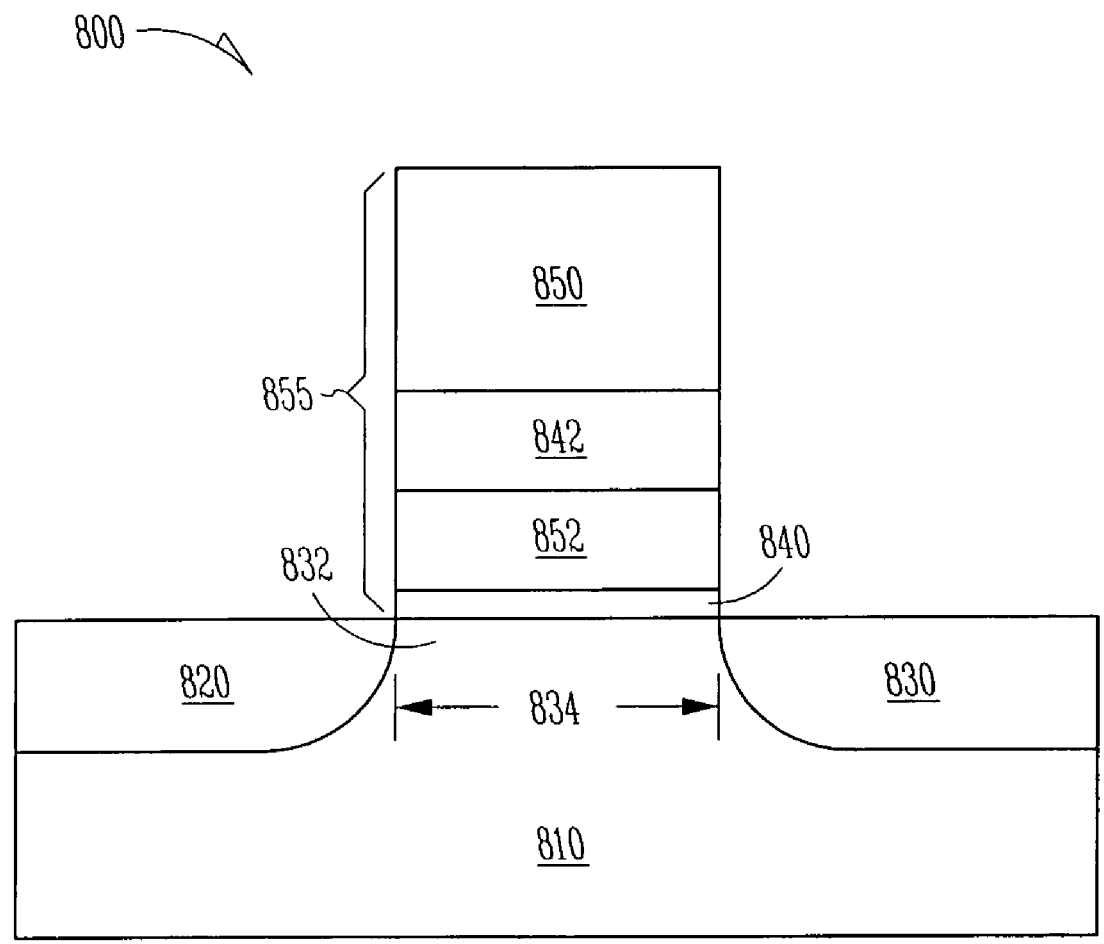
FIG. 8 shows an embodiment of a configuration of a transistor capable of being fabricated according to the teachings of the present invention.

The method for forming a lanthanide doped $TiO_x$ in various embodiments can be applied to other transistor structures having dielectric layers. FIG. 8 shows an embodiment of a configuration of a transistor 800 capable of being fabricated, according to the teachings of the present invention. In the embodiment of FIG. 8, transistor 800 includes a silicon based substrate 810 with a source 820 and a drain 830 separated by a body region 832. The body region 832 between the source 820 and the drain 830 defines a channel region having a channel length 834. Located above the body region 832 is a stack 855 including a gate dielectric 840, a floating gate 852, a floating gate dielectric 842, and control gate 850. The gate dielectric 840 can be formed as described above with the remaining elements of the transistor 800 formed using processes known to those skilled in the art. Alternately, both the gate dielectric 840 and the floating gate dielectric 842 can be formed as dielectric layers containing lanthanide doped $TiO_x$ in various embodiments as described herein.

The embodiments of methods for forming lanthanide doped $TiO_x$ dielectric films can also be applied to forming capacitors in various integrated circuits, memory devices, and electronic systems. In one embodiment for forming a capacitor, a method can include forming a first conductive layer, evaporating a Ti source at a first rate, evaporating a lanthanide source at a second rate, controlling the first rate and the second rate to form a Ti/lanthanide film on the first conductive layer, oxidizing the Ti/lanthanide film using a plasma to form a dielectric film, and forming a second conductive layer on the dielectric. Controlling the evaporation rates allows the lanthanide to be selectively doped in the Ti film within a predetermined range for the percentage of the lanthanide in the Ti/lanthanide layer. Alternately, a capacitor can be formed by forming a conductive layer on a substrate, forming a dielectric film containing lanthanide doped $TiO_x$ using any of the embodiments described herein, and forming another conductive layer on the dielectric film.

Figure 9:
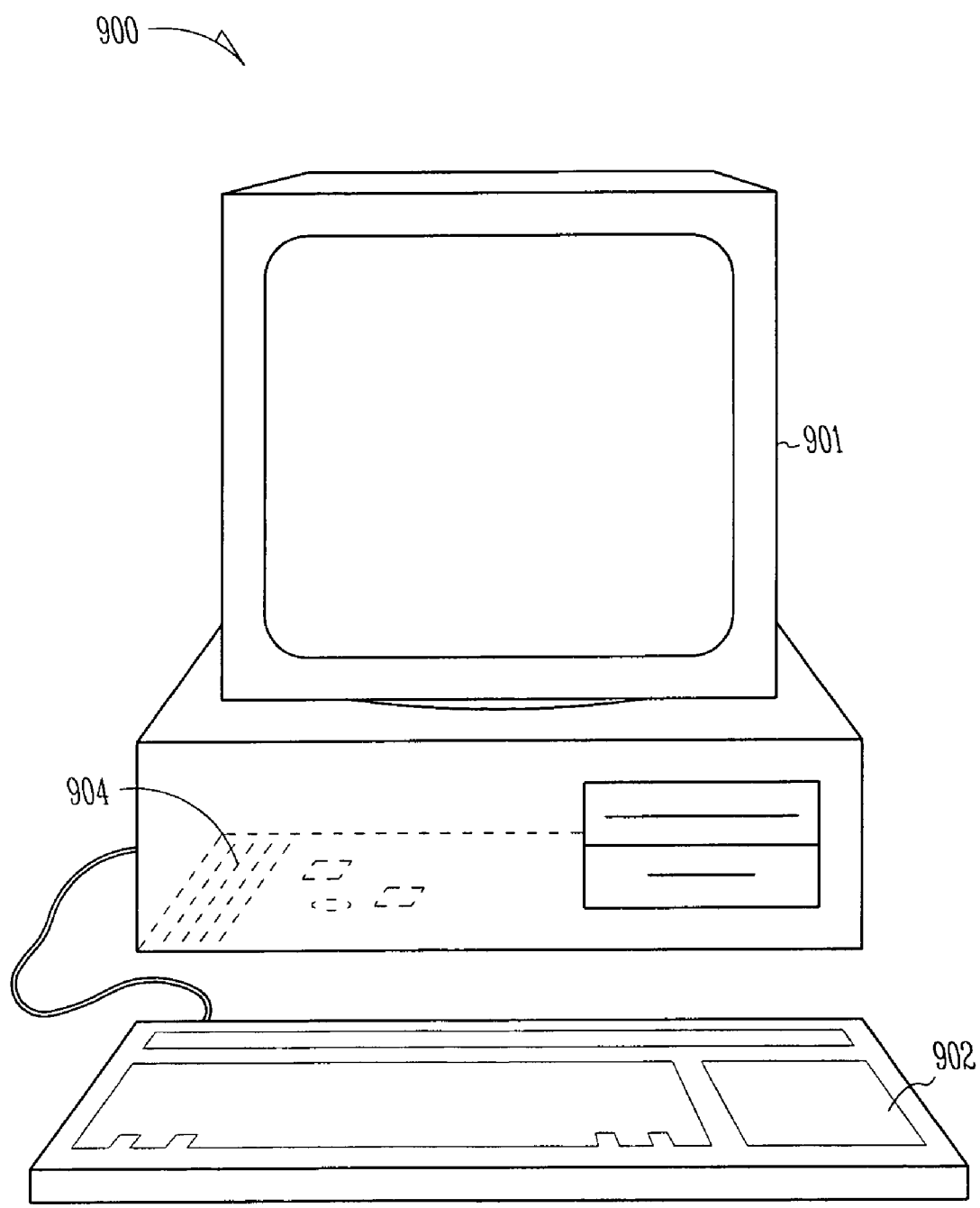
FIG. 9 shows an embodiment of a personal computer incorporating devices according to the teachings of the present invention.
Figure 10:
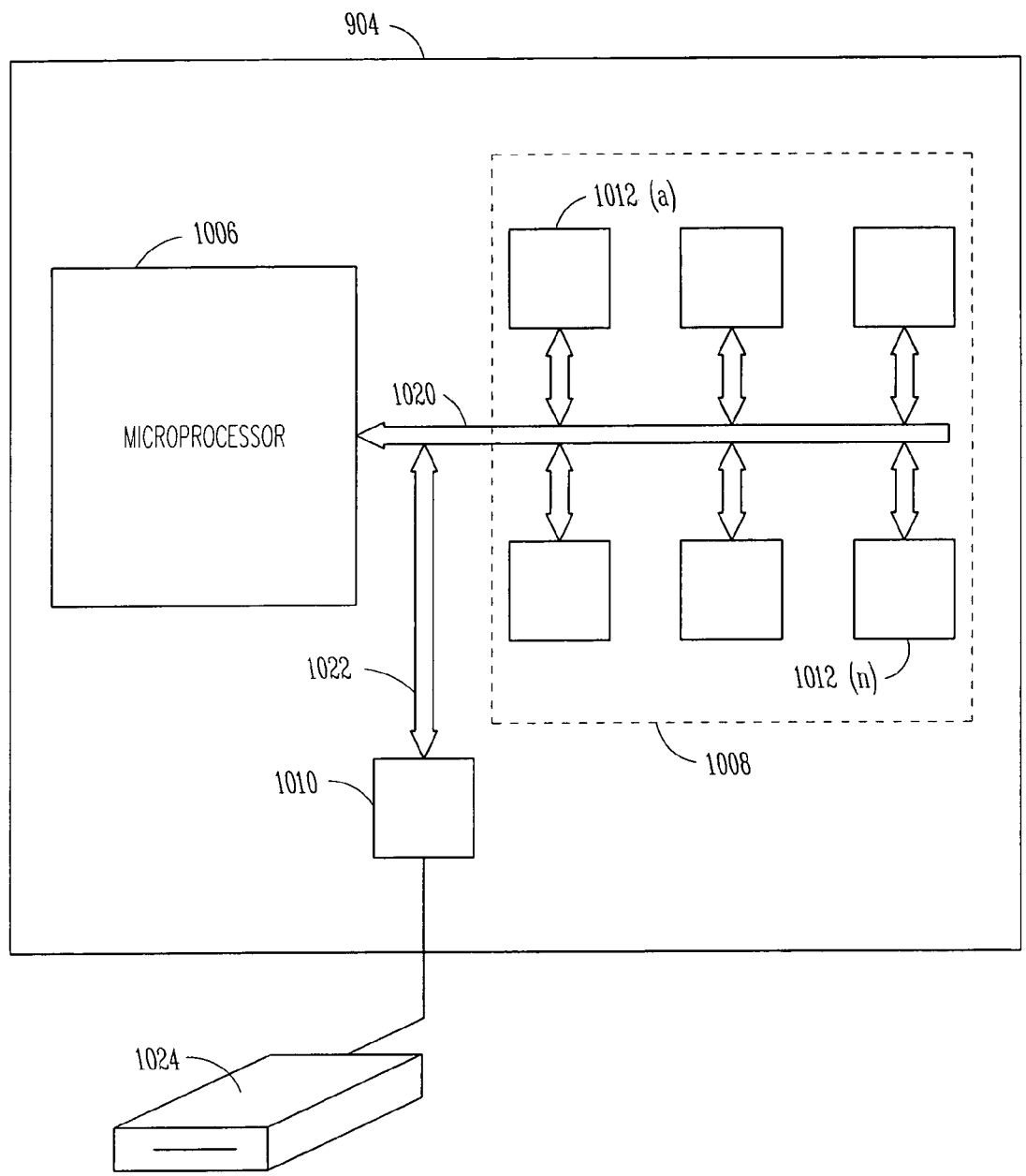
FIG. 10 illustrates a schematic view of an embodiment of a central processing unit incorporating devices according to the teachings of the present invention.
Figure 11:
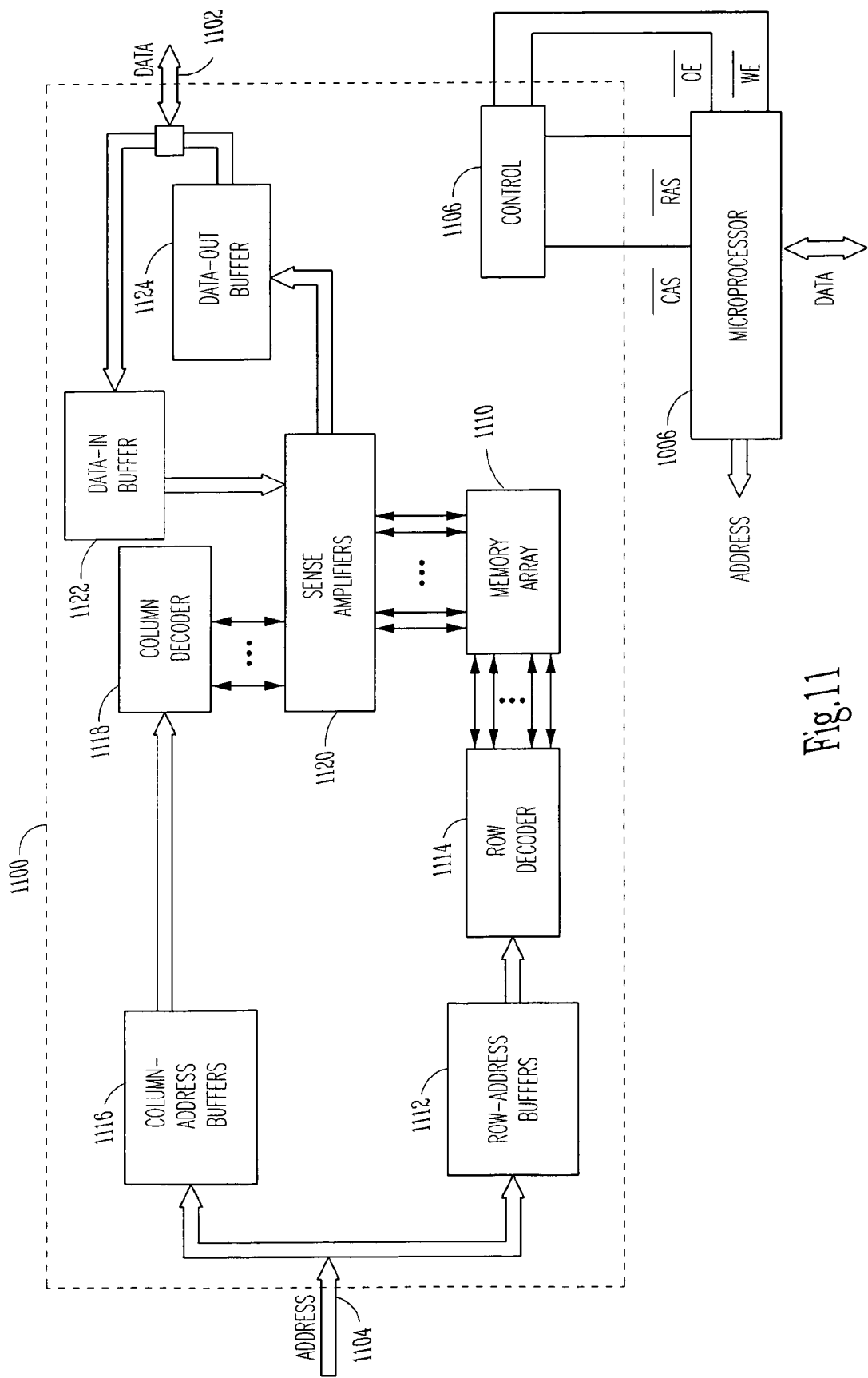
FIG. 11 illustrates a schematic view of an embodiment of a DRAM memory device, according to the teachings of the present invention.

Transistors, capacitors, and other devices having dielectric films or layers created by the methods described above may be implemented into memory devices and electronic systems including information handling devices. Information handling devices having a dielectric layer containing lanthanide doped $TiO_x$ can be constructed using various embodiments of the methods described above. Such information devices can include wireless systems, telecommunication systems, and computers. An embodiment of a computer having a dielectric layer containing lanthanide doped $TiO_x$ is shown in FIGS. 9-11 and described below. While specific types of memory devices and computing devices are shown below, it will be recognized by one skilled in the art that several types of memory devices and electronic systems including information handling devices utilize the invention.

A personal computer, as shown in FIGS. 9 and 10, can include a monitor 900, keyboard input 902 and a central processing unit 904. The processor unit typically includes microprocessor 1006, memory bus circuit 1008 having a plurality of memory slots 1012(a-n), and other peripheral circuitry 1010. Peripheral circuitry 1010 permits various peripheral devices 1024 to interface processor-memory bus 1020 over input/output (I/O) bus 1022. The personal computer shown in FIGS. 9 and 10 also includes at least one transistor having a gate dielectric in accordance with an embodiment of the present invention.

Microprocessor 1006 produces control and address signals to control the exchange of data between memory bus circuit 1008 and microprocessor 1006 and between memory bus circuit 1008 and peripheral circuitry 1010. This exchange of data is accomplished over high speed memory bus 1020 and over high speed I/O bus 1022.

Coupled to memory bus 1020 are a plurality of memory slots 1012(a-n) which receive memory devices well known to those skilled in the art. For example, single in-line memory modules (SIMMs) and dual in-line memory modules (DIMMs) may be used in the implementation of embodiment of the present invention.

These memory devices can be produced in a variety of designs which provide different methods of reading from and writing to the dynamic memory cells of memory slots 1012. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 1008.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 1020. Other alternative types of devices include SDRAM, DDR SDRAM, SLDRAM and Direct RDRAM as well as others such as SRAM or Flash memories.

FIG. 11 illustrates a schematic view of an embodiment of a DRAM memory device 1100, according to the teachings of the present invention. Illustrative DRAM memory device 1100 is compatible with memory slots 1012(a-n). The description of DRAM memory device 1100 has been simplified for purposes of illustrating a DRAM memory device and is not intended to be a complete description of all the features of a DRAM. Those skilled in the art will recognize that a wide variety of memory devices may be used in the implementation of embodiments of the present invention. The embodiment of a DRAM memory device shown in FIG. 11 includes at least one transistor having a gate dielectric containing lanthanide doped $TiO_x$ according to the teachings of the present invention.

Control, address and data information provided over memory bus 1020 is further represented by individual inputs to DRAM 1100, as shown in FIG. 11. These individual representations are illustrated by data lines 1102, address lines 1104 and various discrete lines directed to control logic 1106.

As is well known in the art, DRAM 1100 includes memory array 1110 which in turn comprises rows and columns of addressable memory cells. Each memory cell in a row is coupled to a common word line. The word line is coupled to gates of individual transistors, where at least one transistor has a gate coupled to a gate dielectric containing lanthanide doped $TiO_x$ in accordance with the method and structure previously described above. Additionally, each memory cell in a column is coupled to a common bit line. Each cell in memory array 1110 includes a storage capacitor and an access transistor as is conventional in the art.

DRAM 1100 interfaces with, for example, microprocessor 1006 through address lines 1104 and data lines 1102. Alternatively, DRAM 1100 may interface with a DRAM controller, a micro-controller, a chip set or other electronic system. Microprocessor 1006 also provides a number of control signals to DRAM 1100, including but not limited to, row and column address strobe signals RAS and CAS, write enable signal WE, an output enable signal OE and other conventional control signals.

Row address buffer 1112 and row decoder 1114 receive and decode row addresses from row address signals provided on address lines 1104 by microprocessor 1006. Each unique row address corresponds to a row of cells in memory array 1110. Row decoder 1114 includes a word line driver, an address decoder tree, and circuitry which translates a given row address received from row address buffers 1112 and selectively activates the appropriate word line of memory array 1110 via the word line drivers.

Column address buffer 1116 and column decoder 1118 receive and decode column address signals provided on address lines 1104. Column decoder 1118 also determines when a column is defective and the address of a replacement column. Column decoder 1118 is coupled to sense amplifiers 1120. Sense amplifiers 1120 are coupled to complementary pairs of bit lines of memory array 1110.

Sense amplifiers 1120 are coupled to data-in buffer 1122 and data-out buffer 1124. Data-in buffers 1122 and data-out buffers 1124 are coupled to data lines 1102. During a write operation, data lines 1102 provide data to data-in buffer 1122. Sense amplifier 1120 receives data from data-in buffer 1122 and stores the data in memory array 1110 as a charge on a capacitor of a cell at an address specified on address lines 1104.

During a read operation, DRAM 1100 transfers data to microprocessor 1006 from memory array 1110. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 1120 detects and amplifies a difference in voltage between the complementary bit lines. The sense amplifier passes the amplified voltage to data-out buffer 1124.

Control logic 1106 is used to control the many available functions of DRAM 1100. In addition, various control circuits and signals not detailed herein initiate and synchronize DRAM 1100 operation as known to those skilled in the art. As stated above, the description of DRAM 1100 has been simplified for purposes of illustrating an embodiment of the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

CONCLUSION

A gate dielectric containing a lanthanide doped $TiO_x$ film and a method of fabricating such a film produces a reliable gate dielectric having an equivalent oxide thickness thinner than attainable using $SiO_2$. Gate dielectrics containing a lanthanide doped $TiO_x$ film formed using the methods described herein are thermodynamically stable such that the gate dielectrics formed will have minimal reactions with a silicon substrate or other structures during processing.

Lanthanide doped $TiO_x$ films formed by ion assisted electron beam evaporation of a Ti source and a lanthanide source followed by plasma oxidation can be amorphous and possess smooth surfaces and high packing densities, which limits the occurrence of adsorbed water in the film. Such lanthanide doped $TiO_x$ films can provide enhanced electrical properties due to their smoother surface resulting in reduced leakage current. Furthermore, doping with lanthanide such as Nd, Tb, and Dy provide for increased breakdown electric fields and decreased leakage currents than can be attained with an undoped $TiO_x$ film. In addition, oxidation in a microwave-excited plasma system using a radial line slotted antenna provides for the formation of a uniform oxide layer.

Transistors, higher level ICs or devices, and systems are constructed utilizing the novel process for forming a gate dielectric having an ultra thin equivalent oxide thickness, $t_{eq}$. Gate dielectric layers containing a lanthanide doped film are formed having a high dielectric constant ($\kappa$), where the gate dielectrics are capable of a $t_{eq}$ thinner than 10 Å, thinner than the expected limit for $SiO_2$ gate dielectrics. At the same time, the physical thickness of the lanthanide doped $TiO_x$ film is much larger than the $SiO_2$ thickness associated with the $t_{eq}$ limit of $SiO_2$. Forming the larger thickness provides advantages in processing the gate dielectric. The control of evaporation rates, ion beam properties, plasma environment, and oxygen content provides a wide range for selecting process control. Further, a lanthanide doped $TiO_x$ film processed in relatively low temperatures can provide amorphous dielectric films having relatively low leakage current for use as dielectric layers in electronic devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming an electronic device, comprising:
   evaporating a Ti source at a first rate;
   evaporating a lanthanide source at a second rate;
   controlling the first rate and the second rate to deposit a metallic film on a substrate, the film containing Ti doped with the lanthanide; and
   oxidizing the film using atomic oxygen generated in a plasma to form a dielectric film containing $TiO_x$ doped with the lanthanide $x \geq 0$ such that the $TiO_x$ is a dielectric.

2. The method of claim 1, wherein evaporating a lanthanide source includes evaporating a lanthanide selected from a group consisting of Nd, Tb, and Dy.

3. The method of claim 1, wherein oxidizing the film using atomic oxygen generated in a plasma includes generating atomic oxygen in a Krypton/oxygen plasma.

4. A method of forming a transistor, comprising:
   forming a source region and a drain region separated by a body region;
   evaporating a Ti source at a first rate;
   evaporating a lanthanide source at a second rate;
   controlling the first rate and the second rate to deposit a metallic film on the body region, the metallic film containing Ti doped with the lanthanide; and
   oxidizing the metallic film using atomic oxygen generated in a plasma to form a dielectric film containing $TiO_x$ doped with the lanthanide, $x \geq 0$ such that the $TiO_x$ is a dielectric; and
   coupling a gate to the dielectric film containing lanthanide doped $TiO_x$.

5. The method of claim 4, wherein evaporating a lanthanide source includes evaporating a lanthanide selected from a group consisting of Nd, Tb, and Dy.

6. The method of claim 4, wherein evaporating a Ti source includes evaporating the Ti source by electron beam evaporation.

7. The method of claim 4, wherein oxidizing the film using atomic oxygen generated in a plasma includes generating atomic oxygen in a Krypton/oxygen plasma.

8. The method of claim 4, wherein controlling the first rate and the second rate includes controlling the first rate and the second rate to form a Ti film on the substrate doped in the range from about 10% to about 30% lanthanide.

9. The method of claim 4, wherein the method further includes bombarding the surface with ions during the Ti deposition.

10. The method of claim 4, wherein the method further includes supplementing with oxygen using an ionizer ring during the Ti evaporation.

11. The method of claim 4, wherein controlling the first rate and the second rate to deposit a metallic film on a substrate includes controlling the first rate and the second rate to provide a lanthanide doped Ti film on the substrate for growing an amorphous lanthanide doped $TiO_x$ film, $x \geq 0$ such that the amorphous lanthanide doped $TiO_x$ is a dielectric, the dielectric film having a dielectric constant ranging from about 50 to about 110.

12. A method of forming a capacitor, comprising:
   forming a first conductive layer on a substrate;
   evaporating a Ti source at a first rate using a first electron gun;

evaporating a lanthanide source at a second rate using a second electron gun;

controlling the first rate and the second rate to deposit a metallic film on a substrate, the metallic film containing Ti doped with the lanthanide;

oxidizing the metallic film using atomic oxygen generated in a plasma to form a dielectric film containing $TiO_x$ doped with the lanthanide, $x \geq 0$ such that the $TiO_x$ is a dielectric; and forming a second conductive layer on the dielectric film.

13. The method of claim 12, wherein evaporating a lanthanide source includes evaporating a lanthanide selected from a group consisting of Nd, Tb, and Dy.

14. The method of claim 12, wherein oxidizing the film using atomic oxygen generated in a plasma includes generating atomic oxygen in a Krypton/oxygen plasma.

15. The method of claim 12, wherein controlling the first rate and the second rate includes controlling the first rate and the second rate to provide a lanthanide doped Ti film on the substrate for growing the dielectric film doped in the range from about 5% to about 40% lanthanide.

16. The method of claim 12, wherein the method further includes bombarding the surface with ions during Ti deposition.

17. The method of claim 12, wherein the method further includes supplementing with oxygen using an ionizer ring during evaporating the Ti source and the lanthanide source.

18. The method of claim 12, wherein controlling the first rate and the second rate to deposit a metallic film on a substrate includes controlling the first rate and the second rate to provide a lanthanide doped Ti film on the substrate for growing an amorphous lanthanide doped $TiO_x$ film, $x \geq 0$ such that the amorphous lanthanide doped $TiO_x$ is a dielectric, the dielectric film having a dielectric constant ranging from about 50 to about 110.

19. A method of forming a memory, comprising:

forming a number of access transistors, at least one access transistor including a gate coupled to a dielectric film on a body region between a source region and a drain region, the dielectric film formed by a method including:

evaporating a Ti source at a first rate;

evaporating a lanthanide source at a second rate;

controlling the first rate and the second rate to deposit a metallic film on the body region, the metallic film containing Ti doped with the lanthanide; and oxidizing the metallic film using atomic oxygen generated in a plasma to form a dielectric film containing $TiO_x$ doped with the lanthanide, $x \geq 0$ such that the $TiO_x$ is a dielectric;

forming a number of word lines coupled to a number of gates of the number of access transistors;

forming a number of source lines coupled to a number of source regions of the number of access transistors; and forming a number of bit lines coupled to a number of drain regions of the number of access transistors.

20. The method of claim 19, wherein evaporating a lanthanide source includes evaporating the lanthanide selected from a group consisting of Nd, Tb, and Dy.

21. The method of claim 19, wherein evaporating a lanthanide source includes evaporating the lanthanide source by electron beam evaporation.

22. The method of claim 19, wherein oxidizing the film using atomic oxygen generated in a plasma includes generating atomic oxygen in a Krypton/oxygen plasma.

23. The method of claim 19, wherein controlling the first rate and the second rate includes controlling the first rate and the second rate to provide a lanthanide doped Ti film on the substrate for growing the dielectric film doped in the range from about 5% to about 40% lanthanide.

24. The method of claim 23, wherein the method further includes bombarding the surface with ions during the Ti source and the lanthanide source evaporation.

25. The method of claim 23, wherein controlling the first rate and the second rate to deposit a metallic film on a substrate and oxidizing the film using atomic oxygen generated in a plasma provides an amorphous lanthanide doped $TiO_x$ film, $x \geq 0$ such that the amorphous lanthanide doped $TiO_x$ is a dielectric.

26. A method of forming an electronic system, comprising:

providing a processor;

coupling an electronic device to the processor, wherein the processor or the electronic device includes a dielectric film on a substrate, the dielectric film formed by a method including:

evaporating a Ti source at a first rate using a first electron gun;

evaporating a lanthanide source at a second rate using a second electron gun;

controlling the first rate and the second rate to deposit a metallic film on the substrate, the metallic film containing Ti doped with the lanthanide; and oxidizing the metallic film using atomic oxygen generated in a plasma to form a dielectric film containing $TiO_x$ doped with the lanthanide, $x \geq 0$ such that the $TiO_x$ is a dielectric; and providing a system bus that couples the processor to the electronic device.

27. The method of claim 26, wherein evaporating a lanthanide source includes evaporating a lanthanide selected from a group consisting of Nd, Tb, and Dy.

28. The method of claim 26, wherein oxidizing the film using atomic oxygen generated in a plasma includes generating atomic oxygen in a Krypton/oxygen plasma.

29. The method of claim 26, wherein controlling the first rate and the second rate includes controlling the first rate and the second rate to provide a lanthanide doped Ti film on the substrate for growing the dielectric film doped in the range from about 5% to about 40% lanthanide.

30. The method of claim 26, wherein the method further includes supplementing with oxygen using an ionizer ring during the Ti source and the lanthanide source evaporation.

31. The method of claim 26, wherein controlling the first rate and the second rate to deposit a metallic film on a substrate includes controlling the first rate and the second rate to provide a lanthanide doped Ti film on the substrate for growing an amorphous lanthanide doped $TiO_x$ film, $x \geq 0$ such that the amorphous lanthanide doped $TiO_x$ is a dielectric, the dielectric film having a dielectric constant ranging from about 50 to about 110.

32. The method of claim 26, wherein coupling an electronic device to the processor includes coupling a memory to the processor.

* * * * *